United States Patent
Yamashita et al.

(10) Patent No.: US 9,116,195 B2
(45) Date of Patent: Aug. 25, 2015

(54) MAGNETIC SENSOR AND SENSITIVITY MEASURING METHOD THEREOF

(75) Inventors: Masaya Yamashita, Tokyo (JP); Yo Yamagata, Tokyo (JP)

(73) Assignee: Asahi Kasei EMD Corporation, Tokyo (JP)

(*) Notice: Subject to any disclaimer, the term of this patent is extended or adjusted under 35 U.S.C. 154(b) by 1640 days.

(21) Appl. No.: 12/532,518

(22) PCT Filed: Mar. 21, 2008

(86) PCT No.: PCT/JP2008/055282
§ 371 (c)(1),
(2), (4) Date: Sep. 22, 2009

(87) PCT Pub. No.: WO2008/123144
PCT Pub. Date: Oct. 16, 2008

(65) Prior Publication Data
US 2010/0117638 A1    May 13, 2010

(30) Foreign Application Priority Data
Mar. 23, 2007 (JP) ................... 2007-077742

(51) Int. Cl.
*G01N 27/72* (2006.01)
*G01R 33/07* (2006.01)
*G01R 35/00* (2006.01)

(52) U.S. Cl.
CPC .............. *G01R 33/07* (2013.01); *G01R 35/005* (2013.01)

(58) Field of Classification Search
CPC ................................ G01R 33/07; G01R 35/005
USPC ......... 324/200, 226–234, 246–263, 528–531, 324/76.11, 117 R, 117 H; 327/510, 511; 702/150
See application file for complete search history.

(56) References Cited

U.S. PATENT DOCUMENTS

2004/0207031 A1* 10/2004 Berndt et al. .................. 257/414
2006/0291106 A1* 12/2006 Shoji ......................... 360/324.11
(Continued)

FOREIGN PATENT DOCUMENTS

| EP | 1182461 A | 2/2002 |
|----|-----------|--------|
| EP | 1739444 A | 1/2007 |

(Continued)

OTHER PUBLICATIONS

European Search Report issued on Jul. 31, 2013 in correspondence European patent application No. 08722634.6.
(Continued)

*Primary Examiner* — Melissa Koval
*Assistant Examiner* — Trung Nguyen
(74) *Attorney, Agent, or Firm* — Morgan, Lewis & Bockius LLP

(57) ABSTRACT

The present invention relates to a magnetic sensor with a sensitivity measuring function and a method thereof. Magnetic sensitivity surfaces detect flux density, and a switching unit extracts magnetic field intensity information of each axis, and inputs it to a sensitivity calculating unit. The sensitivity calculating unit calculates the sensitivity from the magnetic field intensity information about the individual axes from the magnetic sensitivity surfaces. The sensitivity calculating unit includes an axial component analyzing unit for analyzing the flux density from the magnetic sensitivity surfaces into magnetic components of the individual axes; a sensitivity decision unit for deciding the sensitivity by comparing the individual axial components of the magnetic field intensity from the axial component analyzing unit with a reference value; and a sensitivity correction unit for carrying out sensitivity correction in accordance with the sensitivity information from the sensitivity decision unit.

43 Claims, 17 Drawing Sheets

(56) References Cited

U.S. PATENT DOCUMENTS

2007/0290282 A1* 12/2007 Belov et al. .................. 257/421
2009/0237074 A1* 9/2009 Kou et al. .................... 324/247
2010/0117638 A1 5/2010 Yamashita et al.

FOREIGN PATENT DOCUMENTS

| | | |
|---|---|---|
| JP | H06-310776 A | 11/1994 |
| JP | 2002-071381 | 3/2002 |
| JP | 2004-151056 | 5/2004 |
| JP | 2004-257995 | 9/2004 |
| JP | 2006-126012 | 5/2006 |
| JP | 2006-275764 | 10/2006 |
| JP | 2007-024518 | 2/2007 |
| JP | 5027217 B2 | 9/2012 |
| JP | 5616399 | 9/2014 |

OTHER PUBLICATIONS

Simon, et al. "Autocalibration of Silicon Hall Devices", Sensors and Actuators A 52, 1996, pp. 203-207.

* cited by examiner

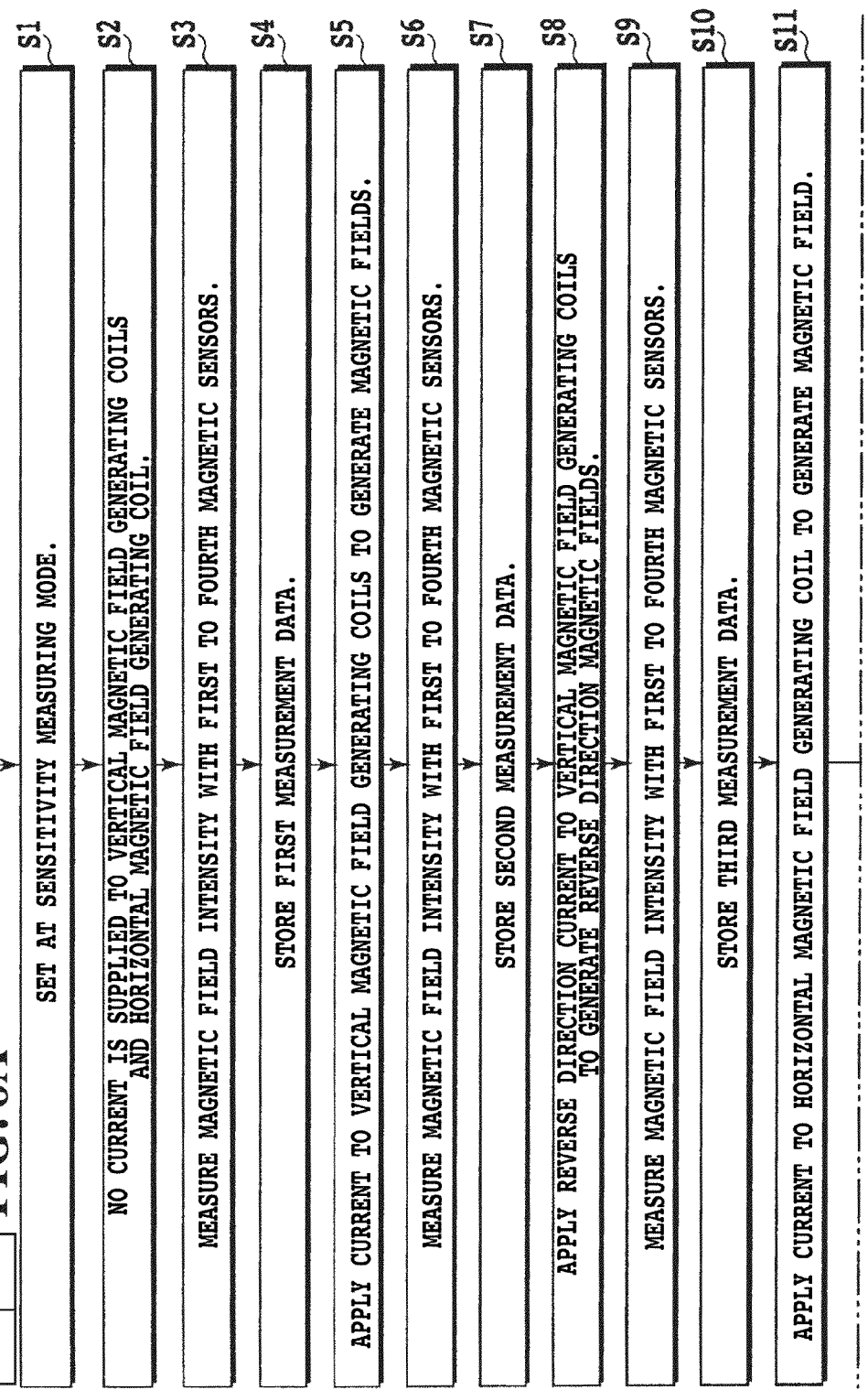

MAGNETIC SENSOR AND SENSITIVITY MEASURING METHOD THEREOF

TECHNICAL FIELD

The present invention relates to a magnetic sensor with a sensitivity measuring function and a sensitivity measuring method thereof, and more particularly to a magnetic sensor and a sensitivity measuring method thereof for providing a sensitivity measuring function to a magnetic sensor having a semiconductor substrate on which a plurality of Hall elements are provided separately from each other and a magnetic substance mounted on the semiconductor substrate.

BACKGROUND ART

As a magnetic sensor, a device has conventionally been well known which has Hall elements provided on a semiconductor substrate and a magnetic substance (magnetic flux concentrator) that is mounted on the Hall elements and has a magnetic convergence function, and which causes magnetic convergence and detects the magnetic field intensity thereof with the Hall elements.

FIG. 1 is a structural view for explaining this type of magnetic sensor. A semiconductor circuit 1 comprises a semiconductor substrate 3 and Hall elements 4a and 4b provided in the semiconductor substrate 3. On the semiconductor circuit 1, a protective layer 5 and an adhesive layer 6 are formed successively, and a magnetic flux concentrator 2 is provided thereon.

As to the magnetic sensor consisting of a combination of the Hall elements with the magnetic substance (magnetic flux concentrator) having the magnetic convergence function, there is a Patent Document 1, for example. The device described in Patent Document 1 relates to a magnetic field direction detecting sensor capable of deciding the directions of a magnetic field two dimensionally. It has a magnetic flux concentrator with a flat shape, a first Hall effect device, and a second Hall effect device, and the Hall effect devices are placed at edge regions of the magnetic flux concentrator.

A device described in Patent Document 2 is a magnetic sensor with the same structure as that shown FIG. 1, and relates to a technique for matching the horizontal direction magnetic field sensitivity and the vertical direction magnetic field sensitivity.

A device described in Patent Document 3 has the following structure. It brings a probe card, which includes a coil for applying a magnetic field to a magnetic sensor, into contact with one of the magnetic sensor modules each having a magnetic sensor and a digital signal processing unit. A test of the magnetic sensor is made by checking the digital signal processing unit via the probe card while generating a magnetic field by supplying a current to the coil. Then, correction values of the magnetic sensor corresponding to the test result are stored in a storage of the magnetic sensor module via a probe card.

Furthermore, as for the sensitivity correction of a Hall element, the following structure is known. As shown in FIG. 2, a vertical direction magnetic field generating coil is placed right under a Hall element to generate a vertical magnetic field component, and the Hall element detects the vertical magnetic field component generated by the vertical direction magnetic field generating coil, thereby correcting the self-sensitivity of the Hall element. Concrete contents thereof are described in Non-Patent Document 1.

The foregoing Patent Document 1 discloses the following. It has a construction that includes the Hall elements provided on the semiconductor substrate and the magnetic substance (magnetic flux concentrator) which has a magnetic convergence function and is mounted on the Hall elements, and that carries out magnetic convergence with the magnetic substance and detects the magnetic field intensity with the Hall elements. In the magnetic sensor that detects the magnetic fields in the horizontal direction and vertical direction to detect 2-axis or 3-axis magnetic signals orthogonal to each other, the magnetic sensitivity varies to the horizontal direction magnetic field and to the vertical direction magnetic field. Accordingly, it is necessary to match the sensitivity between the individual axes.

The present applicant proposes in the foregoing Patent Document 2 a technique for matching the magnetic sensitivity in the horizontal direction and vertical direction by arranging a lot of elements for detecting magnetism in the vertical direction. The method, however, cannot correct sensitivity variations involved in the element sensitivity variations of the individual magnetic sensors or the misalignment of the magnetic substance.

The foregoing Patent Document 3 discloses the following. It brings the probe card, which has the coil for applying the magnetic field to the magnetic sensor, into contact with one of the magnetic sensor modules each including the magnetic sensor and digital signal processing unit, and tests the digital signal processing unit via the probe card while generating the magnetic field by supplying the coil with the current, thereby checking the sensitivity of the magnetic sensor and carrying out the sensitivity correction.

In the Patent Document 3, to check whether the circuit block operates in accordance with the function, it is necessary to perform operations such as providing the external probe card with the coil for generating the magnetic field, and taking the trouble to bring the probe card into close contact with the IC wafer for the measurement. At the same time, to calibrate the magnetic field the coil generates, it is necessary to carry out complicated operations such as preparing a wafer calibrated in advance, and correcting the coil after measuring the wafer once. This presents a problem of entailing test cost.

In such circumstances, it has been investigated to solve the foregoing problems by incorporating an internal coil into a magnetic sensor without using the external coil. Mounting the internal coil on the magnetic sensor makes it possible: 1) to check the functional operation during manufacturing and at shipping; 2) to carry out, for each axis, the sensitivity correction for the variations in the process dependence of the output sensitivity and for the sensitivity deviation of the circuit blocks; 3) to obviate the need for providing a magnetic field test coil (external coil) for generating a uniform magnetic field region in an appropriate range on a test board. This makes it possible to test many magnetic sensors collectively, thereby offering an advantage of reducing the test cost.

In addition, Non-Patent Document 1 discloses the following, for example. It places the vertical direction magnetic field generating coil for generating the vertical magnetic field component right under the Hall element on the same silicon substrate, and detects the vertical magnetic field component generated by the vertical direction magnetic field generating coil with the Hall element, thereby measuring the sensitivity and carrying out correction.

This construction, however, cannot generate any magnetic fields other than the vertical direction magnetic field. Accordingly, as for the magnetic sensor construction, which has sensitivity to 2-axis or 3-axis magnetic components orthogonal to each other, the sensitivity of all the axes cannot be measured with the internal coil.

As described above, the devices described in Patent Documents 1 to 3 and Non-Patent Document 1 are the following. They achieve the sensitivity correction of the Hall element or magnetic sensor in various forms. All the documents have contents relating to magnetic sensors capable of detecting 2-axis or 3-axis magnetic fields orthogonal to each other. However, they do not disclose any concrete configuration for measuring the sensitivity in the individual axial directions of the magnetic sensor without using the external coil, that is, any configuration of arranging internal coils for sensitivity measurement between the magnetic substance and Hall elements.

The present invention is implemented to solve the foregoing problems. Therefore it is an object of the present invention to provide a magnetic sensor and sensitivity measuring method thereof having a function of measuring the sensitivity in the individual axial directions of the magnetic sensor without using an external magnetic field source for sensitivity measurement in a 2-axis or 3-axis magnetic sensor including a semiconductor substrate having a plurality of Hall elements provided separately from each other and a magnetic substance placed on the semiconductor substrate.

Patent Document 1: Japanese Patent Laid-Open No. 2002-71381.

Patent Document 2: Japanese Patent Laid-Open No. 2004-257995.

Patent Document 3: Japanese Patent Laid-Open No. 2007-24518.

Non-Patent Document 1: "Autocalibration of silicon Hall devices" (P. L. C. Simon et al. Sensors and Actuators A 52 (1996) 203-207.

DISCLOSURE OF THE INVENTION

The present invention is implemented to accomplish such objects. A magnetic sensor in accordance with the present invention has a semiconductor substrate provided with a plurality of magnetic sensitivity elements placed separately from each other, and a magnetic substance provided on the semiconductor substrate, in which the magnetic sensitivity elements are placed at edge regions of the magnetic substance, the magnetic sensor comprising: a magnetic field generating unit for generating, for sensitivity measurement, a horizontal magnetic field component in a direction perpendicular to a magnetic sensitivity direction of the magnetic sensitivity elements in a region across the plurality of magnetic sensitivity elements and between the magnetic sensitivity elements and the magnetic substance, wherein the magnetic sensitivity elements detect the horizontal magnetic field component generated by the magnetic field generating unit.

In addition, it is characterized by that the magnetic sensitivity elements and the magnetic field generating unit are placed on the same side with respect to the magnetic substance.

Furthermore, it is characterized by that the horizontal magnetic field component generated by the magnetic field generating unit depends on a thickness of the magnetic substance and a distance between the magnetic substance and the magnetic sensitivity elements.

Furthermore, it is characterized by that the magnetic sensitivity elements are Hall elements.

Furthermore, it is characterized by that the magnetic field generating unit is a planar spiral coil.

Furthermore, it is characterized by further comprising: vertical magnetic field generating units each provided close to each of the plurality of magnetic sensitivity elements for generating, for sensitivity measurement, vertical magnetic field component in a direction parallel to the magnetic sensitivity direction of the magnetic sensitivity elements, wherein the magnetic sensitivity elements detect the vertical magnetic field components generated by the vertical direction magnetic field generating units.

Furthermore, it is characterized by that the vertical magnetic field generating units are placed right above the magnetic sensitivity elements on a plane at the same side as the magnetic field generating unit.

Furthermore, it is characterized by that the vertical magnetic field generating units are placed at edge regions of the magnetic substance, and are placed right under the magnetic sensitivity elements on a plane different from the magnetic field generating unit.

Furthermore, it is characterized by that flux density of the vertical magnetic field components generated by the vertical magnetic field generating units depends on the distance between the magnetic substance and the magnetic sensitivity elements.

Furthermore, it is characterized by that the vertical magnetic field generating units are a loop coil each.

Furthermore, it is characterized by comprising 2-axis or 3-axis detection axes orthogonal to each other.

Furthermore, it is characterized by further comprising a sensitivity calculating unit for calculating sensitivity from magnetic field intensity information about individual axes at the plurality of magnetic sensitivity elements of the magnetic sensor.

Furthermore, it is characterized by that the sensitivity calculating unit comprises: an axial component analyzing unit for separating the magnetic field intensity information from the magnetic sensor into components of the individual axes; a sensitivity decision unit for deciding the sensitivity by comparing the individual axial components of the magnetic field intensity information from the axial component analyzing unit with a prescribed reference value; and a sensitivity correction unit for carrying out sensitivity correction in accordance with sensitivity information from the sensitivity decision unit.

Furthermore, it is characterized by further comprising a sensor diagnostic unit for carrying out self-diagnosis of validity of the sensitivity of the magnetic sensor according to the sensitivity information from the sensitivity decision unit.

Furthermore, it is characterized by further comprising at least one current source for supplying current to the horizontal direction magnetic field generating units and the vertical direction magnetic field generating units of the magnetic sensor.

A sensitivity measuring method in the magnetic sensor in accordance with the present invention is characterized by comprising: a step of generating a horizontal magnetic field component; a step of detecting the horizontal magnetic field component with the magnetic sensitivity elements; a step of calculating sensitivity from flux density at the magnetic sensitivity elements; a step of generating the vertical magnetic field components; a step of detecting the vertical magnetic field components with the magnetic sensitivity elements; and a step of calculating the sensitivity from the flux density at the magnetic sensitivity elements.

In addition, it is characterized by that the step of calculating the sensitivity comprises: a step of separating, with an axial component analyzing unit, magnetic field intensity information from the magnetic sensor into components of the individual axes; a step of deciding, with a sensitivity decision unit, the sensitivity by comparing the individual axial components of the magnetic field intensity information from the axial component analyzing unit with a prescribed reference value; and a step of carrying out, with a sensitivity correction unit, sensitivity correction in accordance with sensitivity information from the sensitivity decision unit.

Furthermore, it is characterized by further comprising a step of carrying out, with a sensor diagnostic unit, self-diagnosis of validity of the sensitivity of the magnetic sensor according to the sensitivity information from the sensitivity decision unit.

According to the magnetic sensor in accordance with the present invention, its configuration is as follows. More specifically, it has a semiconductor substrate provided with a plurality of Hall elements placed separately from each other, and a magnetic substance provided on the semiconductor substrate. In a region across the plurality of Hall elements, and between the Hall elements and the magnetic substance, a magnetic field generating unit for generating a horizontal magnetic field component in a direction perpendicular to the magnetic sensitivity direction of the magnetic sensitivity elements. The horizontal magnetic field component generated by the magnetic field generating unit is detected by the Hall elements. At the same time, close to each of the plurality of Hall elements, each of vertical magnetic field generating units is provided for generating a vertical magnetic field component in a direction parallel to the magnetic sensitivity direction of the magnetic sensitivity elements. The vertical magnetic field components generated by the vertical direction magnetic field generating units are detected by the Hall elements. Thus, it can measure the sensitivity to the vertical direction magnetic field of the magnetic sensor and the sensitivity to the horizontal direction magnetic field.

In addition, as for the sensitivity in the 3-axis directions of the magnetic sensor orthogonal to each other, it can possess a function of correcting sensitivity deviation quantity resulting from variations in process dependence at a time of forming the Hall elements and the magnetic substance or from sensitivity variations of the integrated circuit.

Furthermore, the magnetic sensor includes the sensitivity calculating unit for calculating the sensitivity from the magnetic field intensity information about the individual axes from the plurality of magnetic sensitivity elements of the magnetic sensor. Accordingly, it enables self-sensitivity correction for the sensitivity deviation, and further it enables self-diagnosis in accordance with the validity of the sensitivity decision of the magnetic sensor.

BRIEF DESCRIPTION OF THE DRAWINGS

FIG. 8 is a diagram showing a flowchart for explaining the relationship of FIGS. 8A and 8B;

FIG. 8A is a diagram showing a flowchart for explaining a sensitivity measuring method in the sensitivity measuring device of the magnetic sensor in accordance with the present invention;

BEST MODE FOR CARRYING OUT THE INVENTION

The embodiment in accordance with the present invention will now be described with reference to the accompanying drawings.

In the following embodiments, although magnetic sensitivity elements are described by way of example of Hall elements, the present invention is applicable not only to the Hall elements, but also to any magnetic sensitivity elements capable of detecting a magnetic field perpendicular to the magnetic substance (magnetoresistance element and the like).

Figure 1:
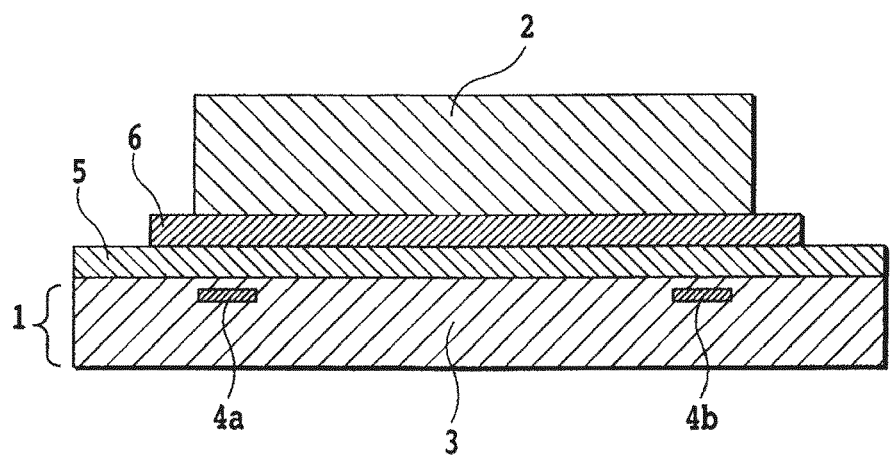
FIG. 1 is a structural view for explaining a conventional magnetic sensor.
Figure 2:
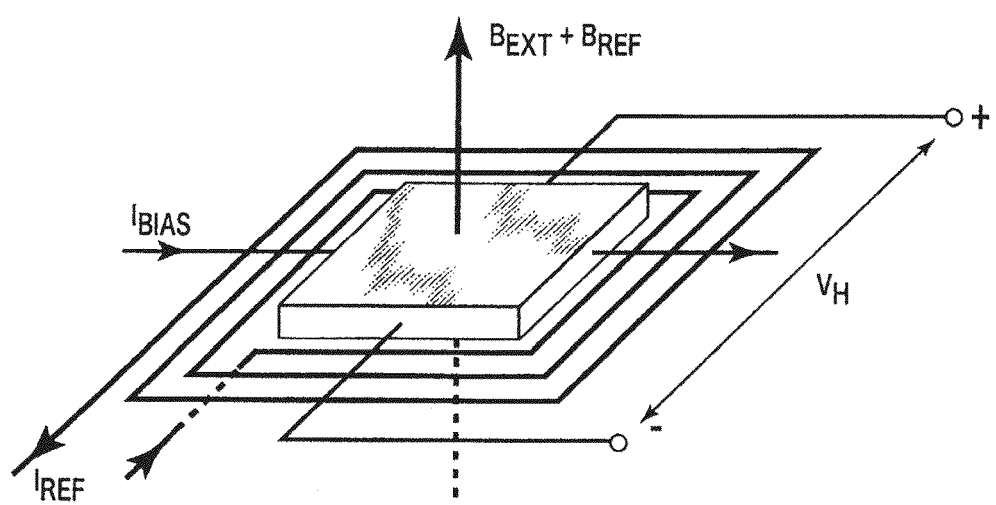
FIG. 2 is a structural view for explaining sensitivity correction of a conventional Hall sensor.
Figure 3:
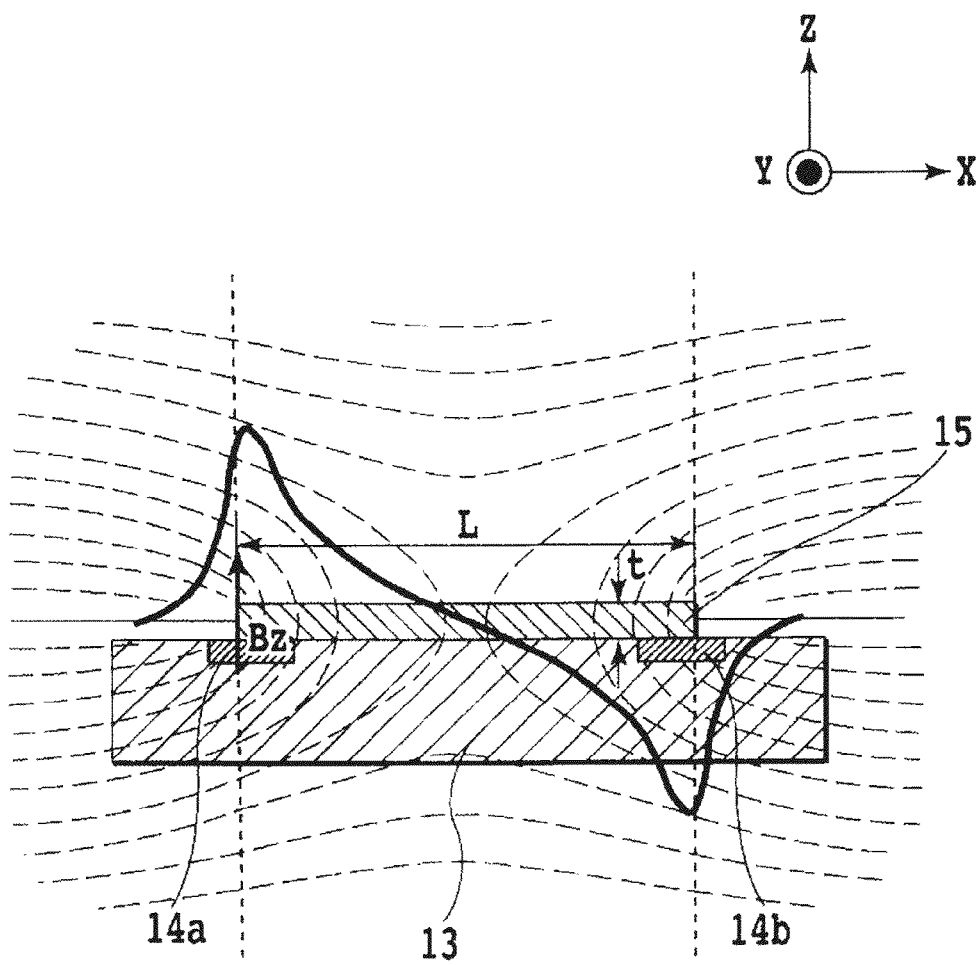
FIG. 3 is a diagram showing magnetic flux distribution around Hall elements of a magnetic sensor in accordance with the present invention.

FIG. 3 is a diagram showing magnetic flux distribution around Hall elements in a magnetic sensor in accordance with the present invention. In FIG. 3, a curved line represented by a solid line shows horizontal-to-vertical magnetic transformation characteristics by the magnetic convergence function of a magnetic substance. It has peak values at edges of the semiconductor substrate 13, and has gentle slopes toward the center. Incidentally, in FIG. 3, reference numerals 14a and 14b designate Hall elements, and 15 designates the magnetic substance.

Here, locations of the arrangement of the Hall elements can be selected at optimum positions in accordance with the application of the magnetic sensor. For example, in the case of matching the sensitivity ratio between the magnetic fields in the horizontal direction and vertical direction, it is better to place the Hall elements a little to the center of the magnetic substance from its edges. In contrast, in the case of increasing the magnetic field sensitivity in the horizontal direction as much as possible, it is better to place the Hall elements at the edges of the magnetic substance.

Incidentally, when the magnetic sensitivity elements are placed nearer to the center of the magnetic substance from its edges, it is preferable that the loop coils be placed close to right above or right under the magnetic sensitivity elements.

Figure 4A:
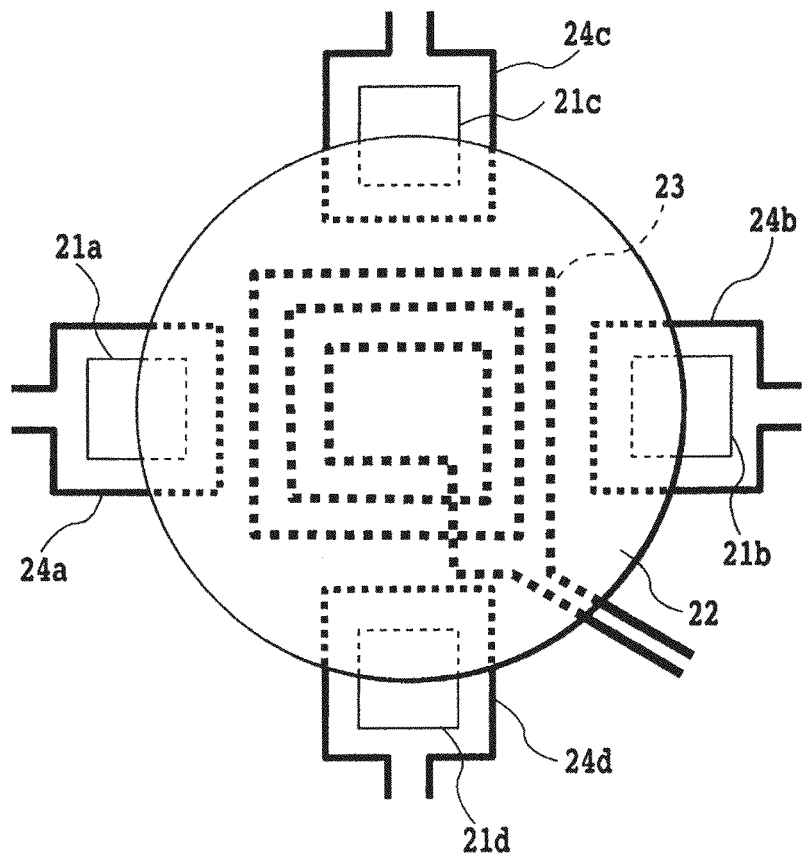
FIG. 4A is a top view showing an embodiment of a magnetic sensor with a sensitivity measuring function in accordance with the present invention.
Figure 4B:
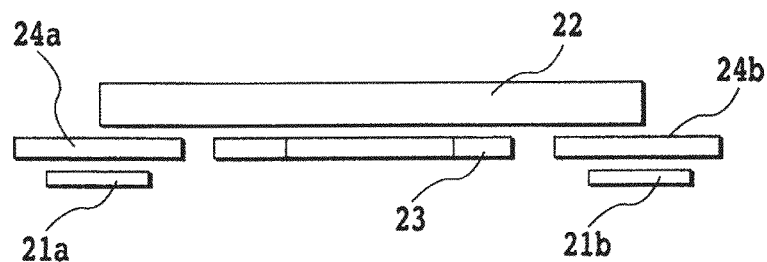
FIG. 4B is a cross-sectional view showing the embodiment of the magnetic sensor with a sensitivity measuring function in accordance with the present invention.

FIG. 4A and FIG. 4B are diagrams showing an embodiment of a magnetic sensor with a sensitivity measuring function in accordance with the present invention: FIG. 4A is a top view; and FIG. 4B is a cross-sectional view. In these figures, reference numerals 21a and 21b designate X-axis Hall elements, 21c and 21d designate Y-axis Hall elements, 22 designates a magnetic substance (magnetic flux concentrator: disk), 23 designates a horizontal direction magnetic field generating coil, and 24a to 24d designate vertical direction magnetic field generating coils.

In the present invention, the magnetic sensor has the following construction. It has the plurality of Hall elements 21a and 21b (X-axis Hall elements) and 21c and 21d (Y-axis Hall elements) mounted separately from each other on a semiconductor substrate (not shown), and the magnetic substance 22 with a magnetic convergence function provided in such a manner as to spread over the individual Hall elements on the semiconductor substrate.

As having been disclosed already in Patent Document 1 and Patent Document 2, the Hall elements 21a to 21d have a 2-axis coordinate system or a 3-axis coordinate system with two coordinate axes or three coordinate axes orthogonal to each other in accordance with a combination with the magnetic substance 22 having the magnetic convergence function, that is, have two or three detection axes orthogonal to each other.

Then, in the present invention, between the Hall elements 21a to 21d and the magnetic substance 22 within the region of the plurality of Hall elements, is provided the horizontal magnetic field generating coil 23 for generating a horizontal magnetic field component in the direction perpendicular to the magnetic sensitivity direction of the magnetic sensitivity elements, and for measuring the sensitivity. Thus, a configuration is made in such a manner as to detect the horizontal magnetic field component generated by the horizontal direction magnetic field generating coil 23 with the Hall elements 21a to 21d provided at the edges of the magnetic substance 22.

Figure 5A:
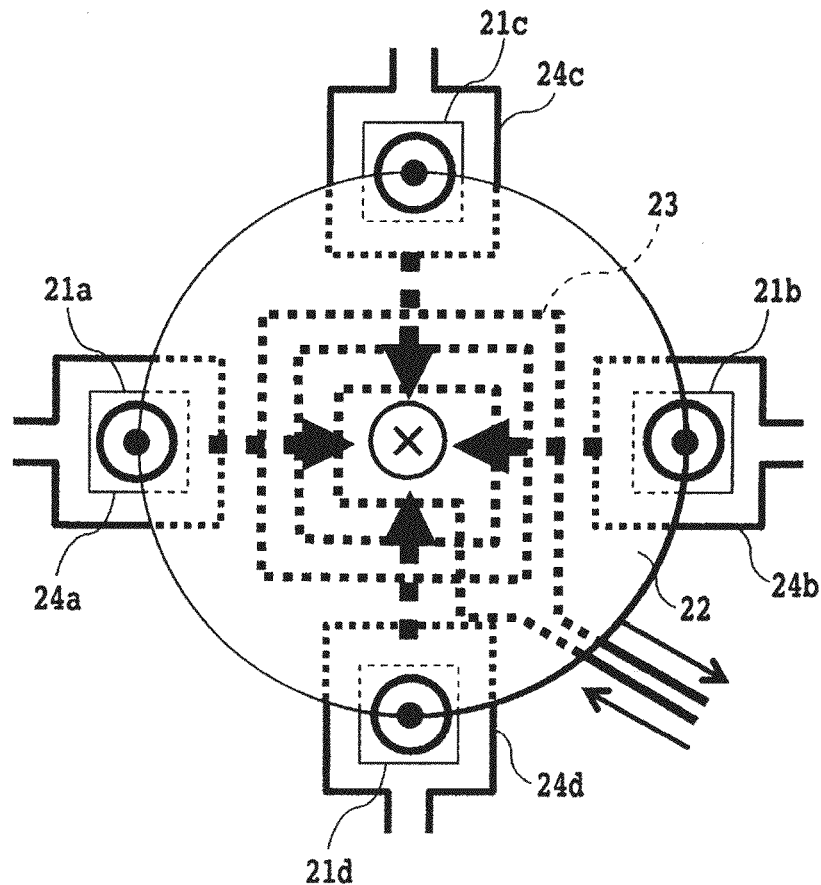
FIG. 5A is a top view of a schematic depiction showing a state of a horizontal magnetic field component generated by a horizontal direction magnetic field generating coil of the magnetic sensor in accordance with the present invention.
Figure 5B:
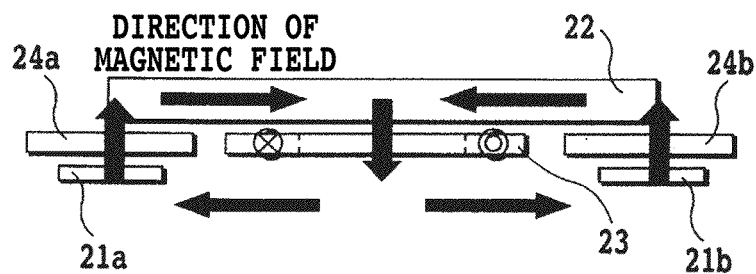
FIG. 5B is a cross-sectional view of the schematic depiction showing the state of the horizontal magnetic field component generated by the horizontal direction magnetic field generating coil of the magnetic sensor in accordance with the present invention.

As for the detection of horizontal magnetic field components, it is carried out by generating the vertical magnetic field components having correlation with the horizontal magnetic field components near the edges of the magnetic substance as shown in FIG. 5B, and by detecting the vertical magnetic field components with the Hall elements.

In addition, the Hall elements 21a to 21d and the horizontal direction magnetic field generating coil 23 are arranged in such a manner as to be placed on the same side with respect to the magnetic substance 22. Furthermore, although the horizontal direction magnetic field generating coil 23 is preferably a planar spiral coil, various shapes are conceivable such as a circle, octagon and tetragon. Moreover, as for its size and number of turns, they can be selected in a variety of ways in accordance with efficiency of the magnetic field generated, the diameter of the magnetic flux concentrator and the arrangement of the Hall elements and so on.

The horizontal direction magnetic field generating coil 23 can be formed using a metal wiring layer in an ordinary IC process. In this case, whether to use a metal layer close to or distant from the substrate, or to use a plurality of wiring layers can be selected considering the amount of generation of the magnetic field and the coil efficiency.

In addition, near the individual Hall elements 21a to 21d, the vertical direction magnetic field generating coils 24a to 24d are provided for generating vertical magnetic field components in the direction parallel to the magnetic sensitivity direction of the magnetic sensitivity elements. The configuration is made in such a manner as to detect the vertical magnetic field components generated by the vertical direction magnetic field generating coils 24a to 24d with the Hall elements 21a to 21d provided at the edges of the magnetic substance 22.

Accordingly, the Hall elements 21a to 21d detect both the horizontal magnetic field component generated by the horizontal direction magnetic field generating coil 23, and the vertical magnetic field components generated by the vertical direction magnetic field generating coils 24a to 24d.

Furthermore, the vertical direction magnetic field generating coils 24a to 24d are arranged in such a manner that they are placed at the edge regions of the magnetic substance 22, and placed right above the Hall elements 21a to 21d on the same surface side of the substrate as the horizontal direction magnetic field generating coil 23.

It is also possible that the vertical direction magnetic field generating coils 24a to 24d are arranged in such a manner that they are placed at the edge regions of the magnetic substance 22, and placed right under the Hall elements 21a to 21d on the different surface side from the horizontal direction magnetic field generating coil 23.

The vertical direction magnetic field generating coils 24a to 24d are preferably loop coils, and their shape can be selected from various shapes such as a circle, square and rectangle in accordance with the shape, size and the number of the Hall elements.

The vertical direction magnetic field generating coils 24 can be formed using a metal wiring layer in an ordinary IC process. In this case, whether to use a metal layer close to or distant from the substrate, or to use a plurality of wiring layers can be selected considering the amount of generation of the magnetic fields and the coil efficiency.

FIG. 5A and FIG. 5B are schematic diagrams showing a state of the horizontal magnetic field component generated by the horizontal direction magnetic field generating coil of the magnetic sensor in accordance with the present invention: FIG. 5A is a top view; and FIG. 5B is a cross-sectional view.

When passing a current through the horizontal direction magnetic field generating coil 23, the horizontal magnetic field components (X-axis components, and Y-axis components) are generated in the direction perpendicular to the magnetic sensitivity direction of the magnetic sensitivity elements, and the vertical magnetic field components (Z-axis components) are generated across the magnetic substance 22 and the Hall elements 21a to 21d as shown by arrows in FIG. 5B.

Since the vertical magnetic field components have correlation with the horizontal magnetic field components, the intensity of the horizontal magnetic field components generated in the direction perpendicular to magnetic sensitivity direction of the magnetic sensitivity elements can be detected by detecting the vertical magnetic field components with the Hall elements 21a to 21d.

Thus, the Hall elements 21a to 21d can detect the horizontal magnetic field components in the direction perpendicular to the magnetic sensitivity direction of the magnetic sensitivity elements, which are generated by the horizontal direction magnetic field generating coil 23.

Figure 6A:
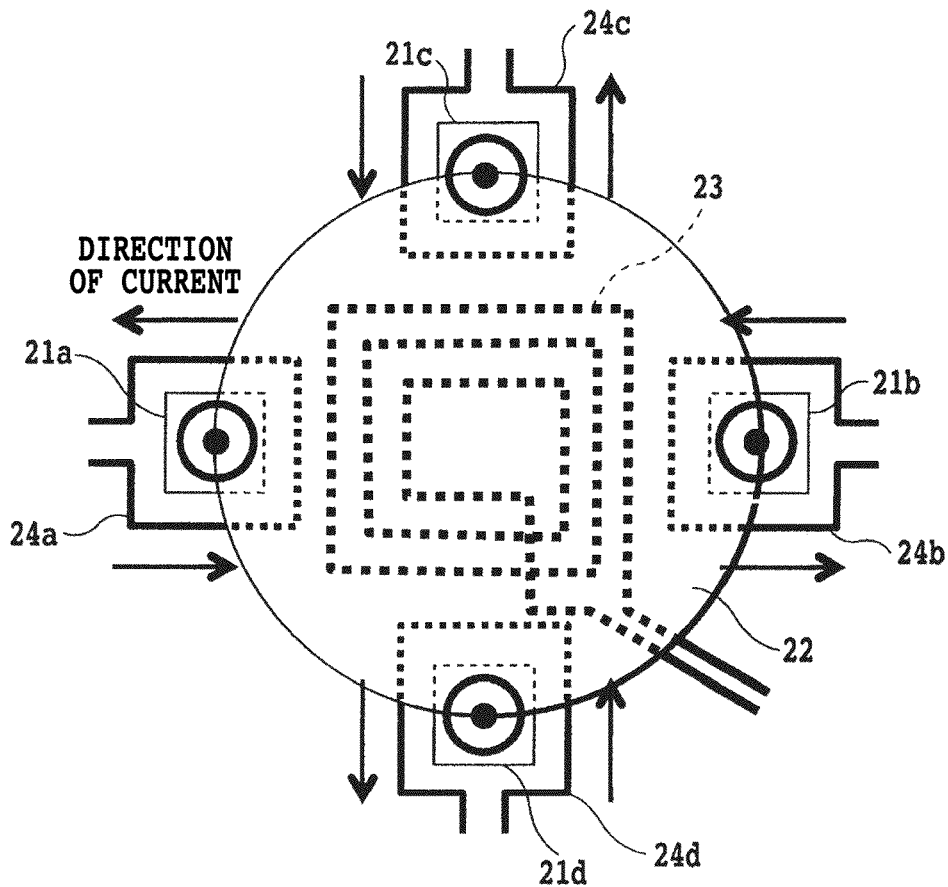
FIG. 6A is a top view of a schematic depiction showing a state of vertical magnetic field components generated by vertical direction magnetic field generating coils of the magnetic sensor in accordance with the present invention.
Figure 6B:
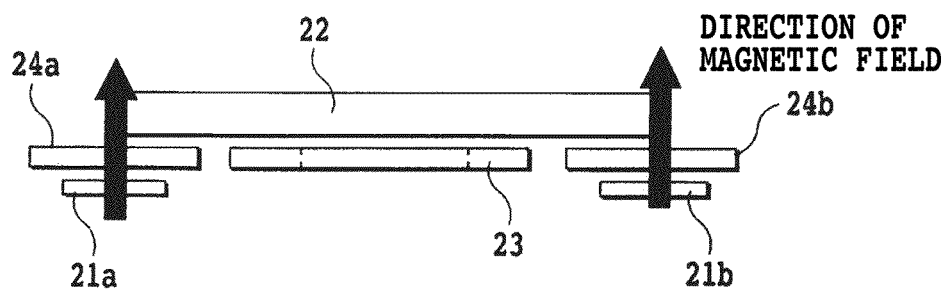
FIG. 6B is a cross-sectional view of the schematic depiction showing the state of the vertical magnetic field components generated by the vertical direction magnetic field generating coils of the magnetic sensor in accordance with the present invention.

FIG. 6A and FIG. 6B are schematic diagrams showing a generated state of the vertical magnetic field components by the vertical direction magnetic field generating coils of the magnetic sensor in accordance with the present invention: FIG. 6A is a top view; and FIG. 6B is a cross-sectional view.

When passing a current through the vertical direction magnetic field generating coils 24a to 24d, the vertical magnetic field components (Z-axis components) are generated across the magnetic substance 22 and the Hall elements 21a to 21d as shown by arrows in FIG. 6B. The intensity of the vertical magnetic field components can be detected by detecting the vertical magnetic field components with the Hall elements 21a to 21d. Thus, the Hall elements 21a to 21d can detect the vertical magnetic field components across the magnetic substance 22 and the Hall elements 21a to 21d, which are generated by the vertical direction magnetic field generating coils 24a to 24d.

Here, the horizontal magnetic field components generated by the horizontal direction magnetic field generating coil 23 depend on the thickness of the magnetic substance 22 of the magnetic sensor and on the distance between the magnetic substance 22 and the Hall elements 21a to 21d. The vertical magnetic field components generated by the vertical direction magnetic field generating coils 24a to 24d depend on the distance between the magnetic substance 22 and the Hall elements 21a to 21d.

Figure 7:
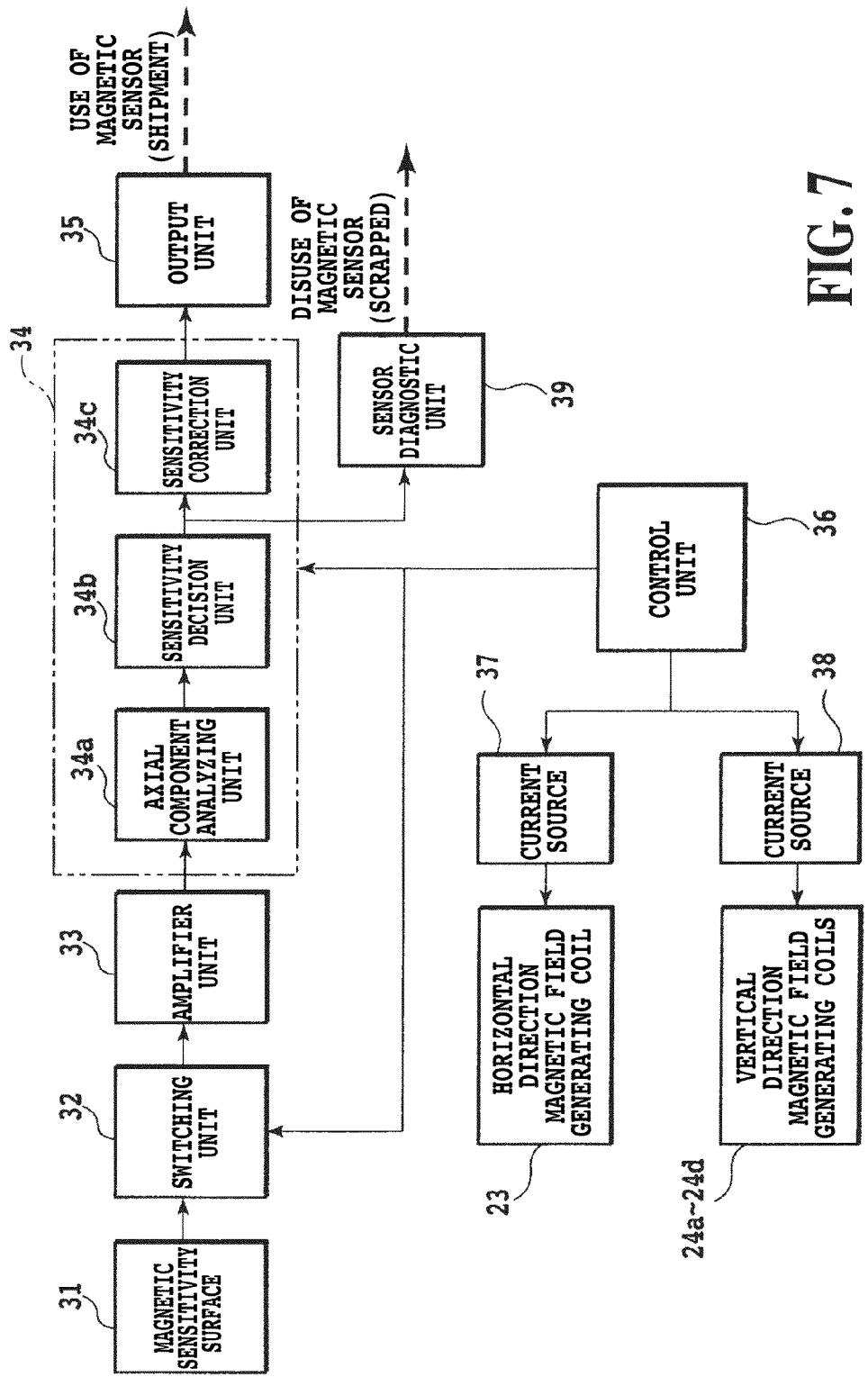
FIG. 7 is a block diagram showing a configuration of a sensitivity measuring device of the magnetic sensor in accordance with the present invention.

FIG. 7 is a block diagram showing a configuration of the magnetic sensor with a sensitivity measuring function in accordance with the present invention. In FIG. 7, the reference numeral 31 designates magnetic sensitivity elements, 32 designates a switching unit, 33 designates an amplifier unit, 34 designates a sensitivity calculating unit, 34a designates an axial component analyzing unit, 34b designates a sensitivity decision unit, 34c designates a sensitivity correction unit, 35 designates an output unit, 36 designates a control unit, 37 and 38 each designate a current source, and 39 designates a sensor diagnostic unit. The configuration of the magnetic sensitivity surface 31 are exactly as that shown in FIG. 4. As for the flux density detected by the Hall elements 21a to 21d of the magnetic sensitivity elements 31, the switching unit 32 selects it in a time sharing manner in the form of including a magnetic signal corresponding to any one of or a combination of the Hall elements 21a to 21d, and inputs it to the sensitivity calculating unit 34 via the amplifier unit 33. In response to the magnetic signal selected from the Hall elements 21a to 21d of the magnetic sensitivity elements 31 by the switching unit 32, the sensitivity calculating unit 34 calculates the magnetic sensitivity (signal components) in the horizontal directions (X, Y) and vertical direction (Z) orthogonal to each other.

The sensitivity calculating unit 34 includes the axial component analyzing unit 34a for separating the magnetic signal from the magnetic sensitivity elements 31 into individual axial magnetic components; the sensitivity decision unit 34b for comparing each axial magnetic field intensity from the axial component analyzing unit 34a with a reference value to decide the sensitivity; and the sensitivity correction unit 34c for carrying out sensitivity correction in accordance with the sensitivity information from the sensitivity decision unit 34b.

In addition, the control unit 36 controls not only the current supply from the first current source 37 for supplying a current to the horizontal direction magnetic field generating coil 23 of the magnetic sensor, and from the second current source 38 for supplying a current to the vertical magnetic field generating coils 24a to 24d of the magnetic sensor, but also the sensitivity calculating function of the sensitivity calculating unit 34. Although the current sources 37 and 38 are separate in the configuration, they can be combined in practice.

The signal processing carried out by the sensitivity measuring device with such a configuration will now be describe.

The current sources 37 and 38 cause the currents to flow through the horizontal direction magnetic field generating coil 23 or/and the vertical magnetic field generating coils 24a to 24d, thereby generating the magnetic fields. The generated magnetic fields pass through the magneto-sensitive surfaces of the Hall elements formed in the integrated circuit plane via the magnetic substance 22, and are detected. As for the placement of the magnetic detecting units, the Hall elements are arranged at the positions facing each other across the magnetic substance 22 in the X and Y axial directions. Among the facing Hall elements, one side on the X-axis is denoted by X1 and the other side by X2, and one side on the Y-axis is denoted by Y1 and the other side by Y2. Here, each of X1, X2, Y1 and Y2 can comprise a plurality of magnetic sensitivity elements. In addition, as described before, the magnetic sensitivity elements is not limited to the Hall elements.

Being detected by the magnetic detecting units 31, the X1, X2, Y1 and Y2, for example, are detected in time sharing via the switching unit 32 and amplifier unit 33. Then the axial component analyzing unit 34a of the sensitivity calculating unit 34 resolves into X-, Y-, and Z-axis components. The resolved X-, Y-, and Z-axis components are each compared with the reference value by the sensitivity decision unit 34b and diagnosed (self-diagnosis).

An example of a procedure of the axial component analysis will be described below.

As to the individual outputs of the X1, X2, Y1 and Y2 obtained by the foregoing procedure, the following calculation is performed. The horizontal direction components are obtained by applying difference processing to the outputs of the facing magnetic sensitivity elements.

$$(X1-X2) = \text{coefficient} \times Hx$$

$$(Y1-Y2) = \text{coefficient} \times Hy$$

In contrast with this, as to the Z-axis perpendicular to the X and Y axes, summation processing is performed.

$$(Y1+Y2) = \text{coefficient} \times Hz$$

In this way, the magnetic field intensity for each of the X, Y, Z-axes is obtained.

In practice, the horizontal direction magnetic field generated from the planar spiral coil enters the individual Hall elements at the magnetic substance edges just as the same vertical direction magnetic field, and the result of the foregoing calculation is obtained as the Z-axis direction signal. However, the magnetic measurement values obtained have correlation with the sensitivity to the horizontal direction magnetic field generated from the planar spiral coil of the magnetic sensor, and at the same time have correlation with the sensitivity to the external uniform horizontal direction magnetic field.

On the other hand, in the case of the loop coil, although it generates a vertical direction magnetic field, when considering the X-axis direction, for example, the magnetic measurement values computed vary depending on whether it generates a magnetic field having the same direction for each of the foregoing X1 and X2, or a magnetic field having different directions for each of them.

When generating the magnetic field having the same direction, it is computed as the Z-axis direction signal, whereas when generating the magnetic field having different directions, it is computed as the X-axis direction signal. However, the magnetic measurement values computed have correlation with the sensitivity to the vertical direction magnetic field generated from the loop coil of the magnetic sensor, and at the same time have the correlation with the sensitivity to the external uniform vertical direction magnetic field.

Acquiring the difference between the Hall element outputs when no current is supplied to the coil and the Hall element outputs when a current is supplied to the coil makes it possible to exclude influences such as external disturbance magnetic fields, and to extract only the signals caused by the magnetic field generated from the coil. Another method is also possible which measures twice while passing the current through the coil in the positive direction and negative direction, and takes the difference between them.

Next, the self-diagnosis function of the sensitivity will be described.

It is possible to employ the loop coils placed right above the Hall elements, and the planar spiral coil placed near the center of the magnetic flux concentrator. For example, by passing current through the spiral coil, a horizontal direction magnetic field is generated around the coil. The horizontal direction magnetic field, after passing through the magnetic substance, emits magnetic flux again to the space at the magnetic substance edges. In this case, as for the direction of the magnetic field, it has vertical direction components which can be detected by the magneto-sensitive surfaces of the Hall elements. By taking the difference from the measurement values when passing no current through the coil or from the measurement values when passing the current in the opposite direction, only the signals resulting from the magnetic field generated from the coil can be extracted. The signal values obtained for a reference current give the sensitivity.

By grasping the difference of the sensitivity obtained by the Hall elements from the sensitivity target value, it becomes possible to decide as to whether the sensitivity of the sensor to the horizontal direction magnetic field is within tolerance or not. Thus, a decision is made as to whether the functional operation of the magnetic substance and Hall elements, and further of the circuit block is normal or not.

Alternatively, it is also possible to pass current through the loop coils placed right above the Hall elements to generate magnetic fields around the coils, and to launch them into the magneto-sensitive surfaces of the Hall elements. This makes it possible to decide as to whether the sensitivity of the magnetic sensor to the vertical direction magnetic field is within tolerance or not. Through the processing described before, the difference between the sensitivity obtained and the sensitivity target value is grasped so that a decision is made as to the functional operation state of each of the magnetic substance and the Hall elements, and further of the circuit block. These calculations are performed by the sensitivity decision unit 34b and the control unit 36 that controls it.

Next, the self-correction function of the sensitivity will be described.

The sensitivity decision unit 34b decides the difference quantities between the sensitivity obtained at the functional operation of the self-diagnosis and the sensitivity target value. In accordance with the difference quantities, the sensitivity correction unit 34c computes, from the difference quantities, correction quantities of the sensitivity to the external uniform magnetic field for the individual axes, and writes the sensitivity correction quantities into fuses or a nonvolatile memory within the same sensitivity correction unit 34. The sensitivity correction quantities, which are usually different for the three axes, can be set, for example, in the Y direction and Z direction with respect to the sensitivity in the X direction. Alternatively, the difference quantities of the measurement values from the standard value for the individual axes can be set separately for the individual axes as the correction quantities. Although the sensitivity correction is carried out for the individual axial signals resolved by the axial component analyzing unit 34a, it can sometimes be applied to the switching unit 32, amplifier unit 33, and further to the magnetic sensitivity elements 31.

Next, the diagnosis of the functional operation will be described.

According to the sensitivity information of the sensitivity decision unit 34b, if the sensitivity deviation quantities are within the tolerance, the sensitivity correction unit 34 carries out the sensitivity correction, and the normal output signal is obtained via the output unit 35 (good item decision, shipment). In addition, the sensor diagnostic unit 39 makes the self-diagnosis as to whether the sensitivity is good or bad based on the sensitivity information from the sensitivity decision unit 34b of the sensitivity calculating unit 34. If a decision of a defective item is made, the magnetic sensor is disused (scrapped).

The sensitivity measuring method in accordance with the present invention enables collective test of a lot of magnetic sensors at shipping, thereby reducing the test cost. In addition, it enables operation verification while a user is using.

Next, the correspondence between the diagnostic mode and measuring mode by the coil will be described.

In FIG. 4, the magnetic substance 22 is assumed to be a circle with a radius of 155 µm. The Hall elements 21a, 21b, 21c and 21d are arranged in such a manner that the centers of the Hall elements are 150 µm from the center of the magnetic substance 22. The size of the magneto-sensitive surface of each Hall element is 15 µm.

It is further assumed that the vertical distance between the Hall element and the bottom surface of the magnetic flux concentrator is 10 µm with process variations of several micrometers around it, and that the radius R can have variations of about several micrometers for 155 µm, the thickness T can have variations of about several micrometers for 13 µm, and the position of the magnetic substance within the horizontal plane can have variations of about several micrometers from the central position.

Here, by passing current through the planar spiral coil, the horizontal direction magnetic field is generated around the coil. The horizontal direction magnetic field passes through the magnetic substance, and the magnetic flux is emitted to the space again at its edges. Here, as for the direction of the magnetic field, it has a vertical direction component which can be detected at the magneto-sensitive surfaces of the Hall element. In the configuration, the fluctuations of the vertical distance between the magnetic substance and the Hall elements, the fluctuations of the diameter of the magnetic substance, the positional discrepancy of the magnetic substance within the horizontal surface, the fluctuations of the thickness of the magnetic substance and so on can be detected in terms of the magnetic field intensity changes (sensitivity changes) on the magneto-sensitive surfaces. By passing current through the loop coils placed right above the Hall elements, the fluctuations of the vertical distance between the magnetic substance and the Hall elements, the fluctuations of the diameter of the magnetic substance, the positional discrepancy of the magnetic substance within the horizontal surface and so on can be mainly detected in terms of the magnetic field intensity changes (sensitivity changes) on the magneto-sensitive surfaces.

For example, for individual process fluctuations, calibration has been performed in advance as to the sensitivity ratio of the individual axes due to the magnetic field of each coil in the diagnostic mode and as to the sensitivity ratio of the individual axes in the measuring mode. According to the calibration curve, the sensitivity correction unit 34c carries out the sensitivity correction (sensitivity adjustment). As for the correction quantity, although a method is preferable which performs the correction numerically on the magnetic output data resolved into the individual axes and output to the output unit 35, it is not limited to the method, and other methods applied to other correction means are also applicable. A gain difference in the post-stage circuit block basically causes sensitivity deviations as a whole of X, Y, and Z. When it is necessary to carry out correction including the absolute values of the sensitivity of the individual axes, it is preferable to carry out correction including the gain fluctuations in the circuit block. If it is enough to make only the sensitivity ratios between the individual axes constant, it is also possible to employ one of the axes as the reference, and to correct the sensitivity ratios between it and the remaining axes rather than correcting the entire gain fluctuations.

Under the foregoing conditions, the appearance of the sensitivity due to the process fluctuations depending on the planar spiral coil and loop coils will be described in detail.

Figure 9:
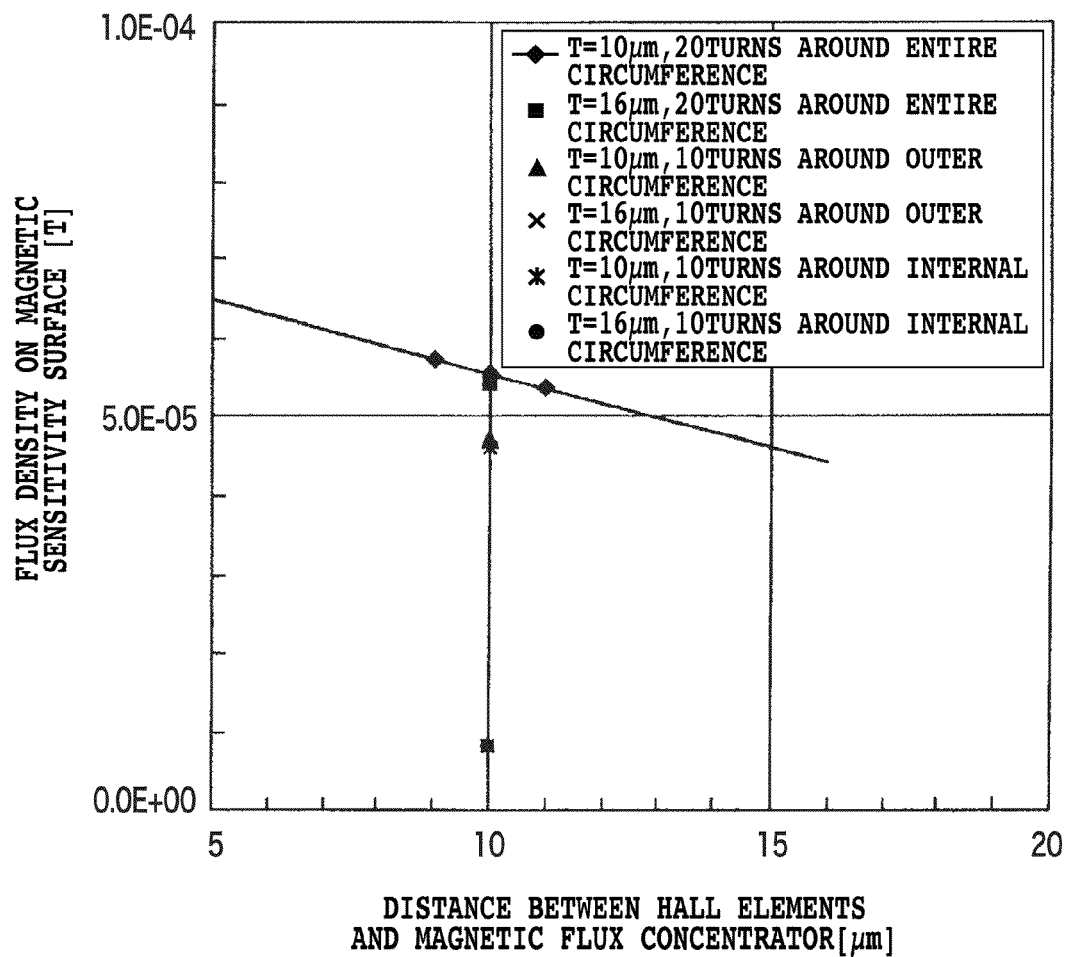
FIG. 9 is a diagram showing relationships between the distance (μm) between Hall elements and the bottom of the magnetic flux concentrator and the flux density (T) (absolute values) on the magneto-sensitive surface when the thickness of the magnetic flux concentrator is varied as a parameter, which shows an example of a planar spiral coil at the self-diagnosis of the sensitivity.

FIG. 9 is a diagram showing relationships between the distance between the Hall elements and the bottom of the magnetic flux concentrator (μm) and the flux density (T) (absolute values) on the magneto-sensitive surface. The thickness of the magnetic flux concentrator is used as a parameter.

Figure 10:
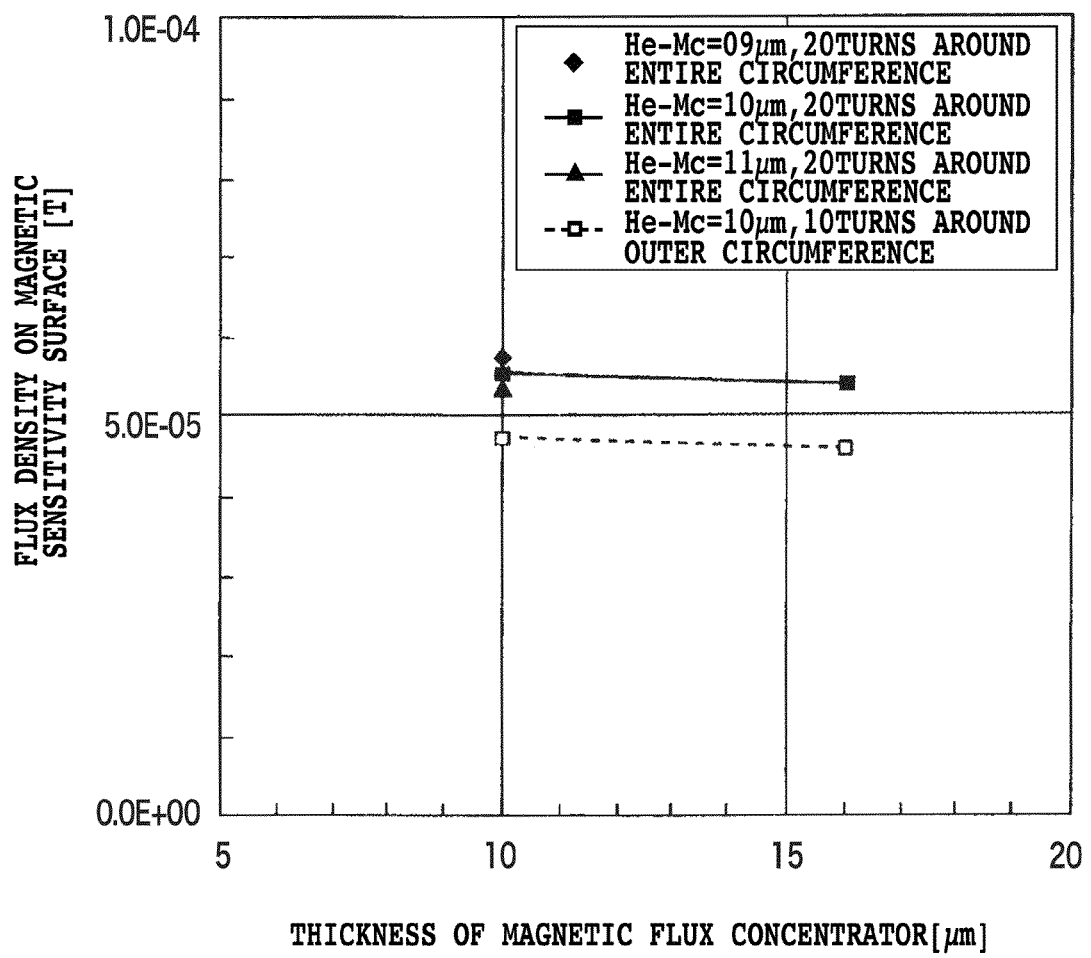
FIG. 10 is a diagram showing relationships between the thickness T (μm) of the magnetic flux concentrator and the flux density (T) (absolute values) on the magneto-sensitive surface when the distance between the Hall element (He) and the bottom of the magnetic flux concentrator (magnetic substance: Mc) is varied as a parameter, which shows an example of the planar spiral coil at the self-diagnosis of the sensitivity.

FIG. 10 is a diagram showing relationships between the thickness of the magnetic flux concentrator T (μm) and the flux density (T) (absolute values) on the magneto-sensitive surface. The distance (μm) across the Hall elements (He) and the bottom of the magnetic flux concentrator (Mc) is employed as a parameter.

Figure 11:
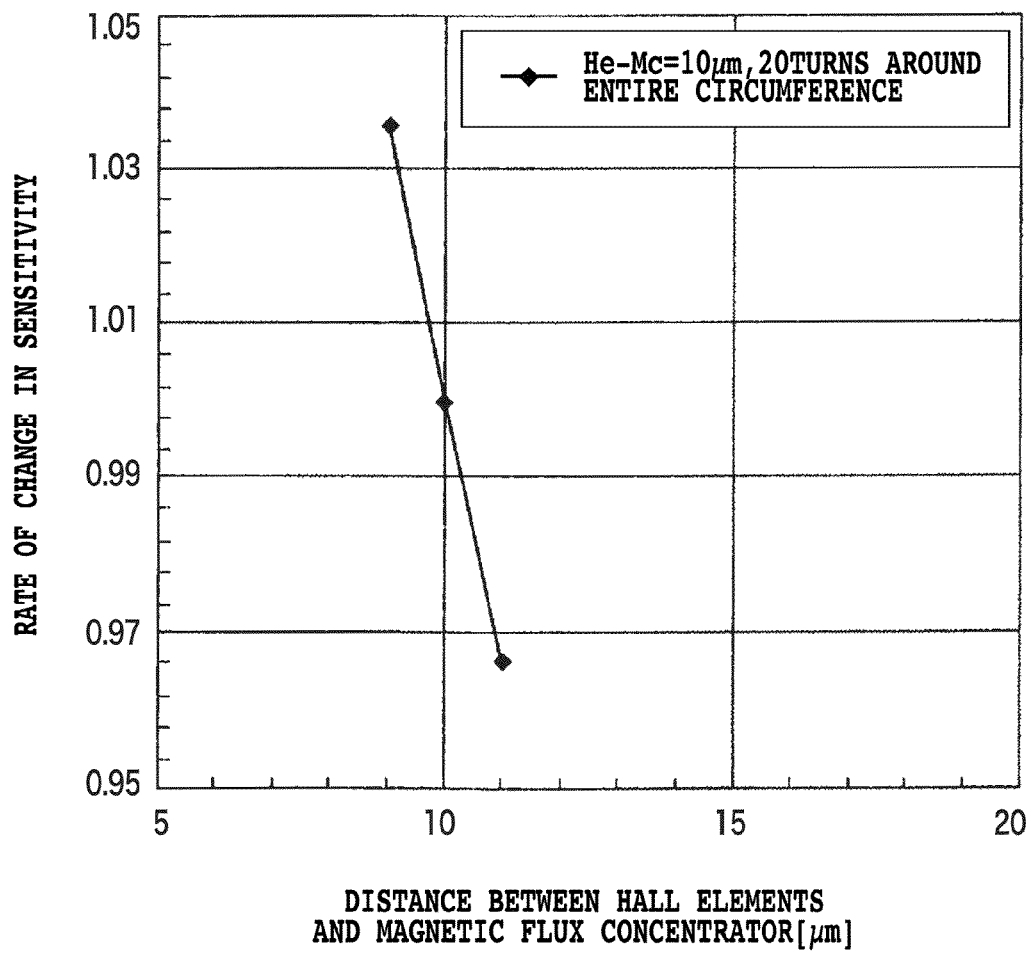
FIG. 11 is a diagram showing relative changes corresponding to FIG. 9.
Figure 12:
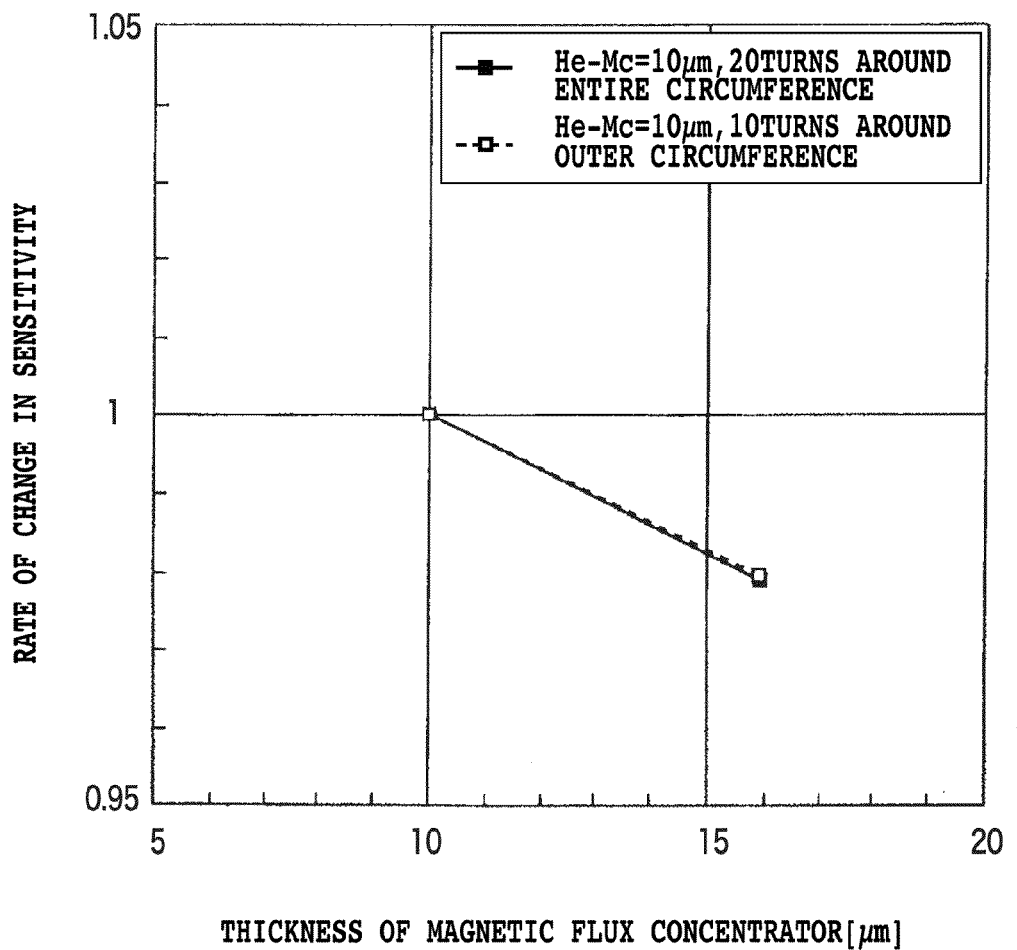
FIG. 12 is a diagram showing relative changes corresponding to FIG. 10.

Either of them shows an example of the planar spiral coil at the time of self-diagnosis of the sensitivity. Incidentally, FIG. 11 and FIG. 12, which correspond to FIG. 9 and FIG. 10, are diagrams showing relative changes seen from the reference position for respective parameters.

As for the planar spiral coil, the following structural example can be given. The diameter of the magnetic flux concentrator (round shape) was 310 μm, and the Hall elements were placed at positions 5 μm inside (underside of the coil) from the edge of the magnetic flux concentrator. It was determined that the shape of coil was octagon, the wiring width of the coil was 4 μm, the wiring spacing was 1 μm, a current of 1 mA was passed through the coil, the coil had 20 turns across 120 to 20 μm from its center, and 10 turns across 120 to 70 μm. The horizontal direction magnetic field generated by the planar spiral coil passes through the magnetic flux concentrator, is changed to the vertical direction component by the convergence plate edge, and is sensed by the Hall elements.

When the distance between the Hall elements and the bottom of the magnetic flux concentrator (vertical distance between them) was 9 to 11 μm, and the thickness of the magnetic flux concentrator was 10 to 16 μm, the magnetic field intensity on the magneto-sensitive surfaces of the Hall elements at the time of passing a current of 1 mA was about 55 μT. When the vertical distance varied from 9 to 11 μm, the sensitivity changed about 7%. When the thickness of the magnetic flux concentrator varied from 10 to 16 μm, the sensitivity changes of about 2% were seen. Thus, it was found that when the vertical distance or the thickness of the magnetic flux concentrator fluctuated with respect to the horizontal direction magnetic field, the magnetic field sensitivity of the Hall elements changed significantly.

As for the loop coils, the following structural example can be given.

Figure 13:
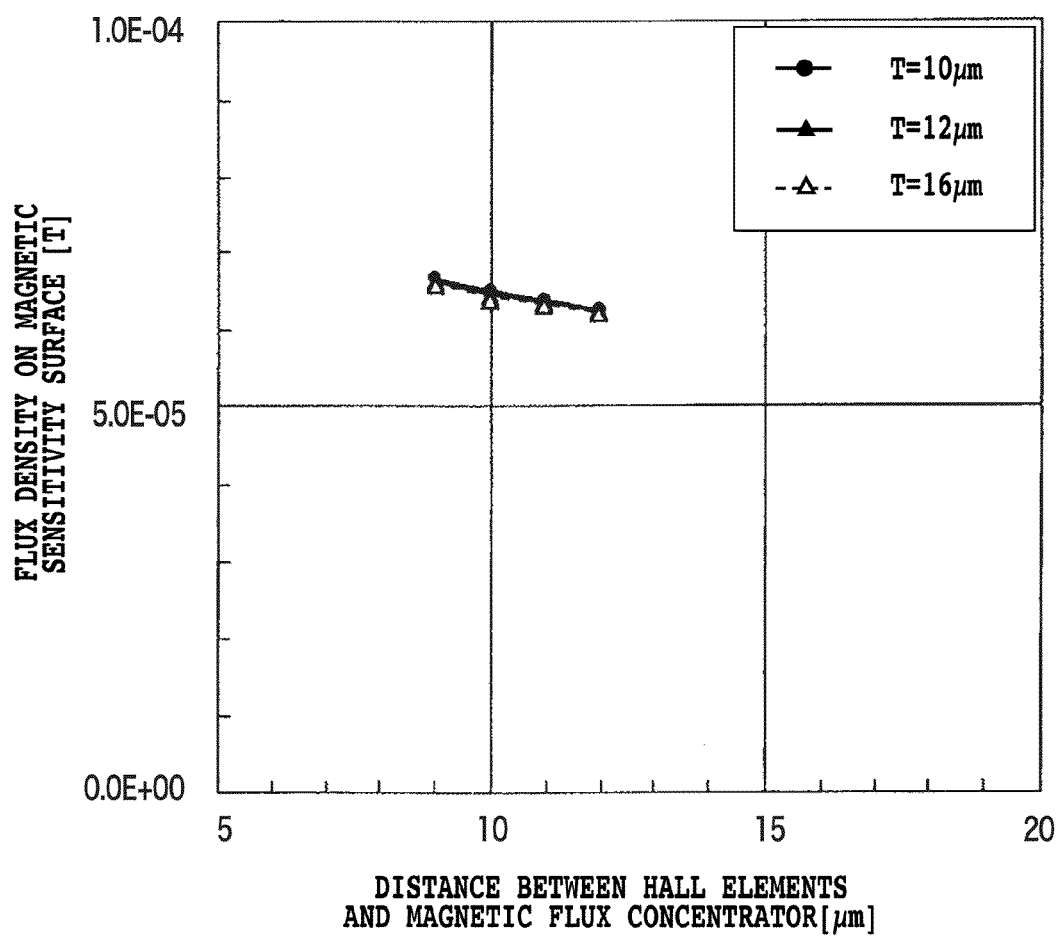
FIG. 13 is a diagram showing relationships between the distance (μm) between the Hall elements and the bottom of the magnetic flux concentrator and the flux density (T) (absolute values) on the magneto-sensitive surface when the thickness of the magnetic flux concentrator is varied as a parameter, which shows an example of a loop coil at the self-diagnosis of the sensitivity.

FIG. 13 is a diagram showing relationships between the distance between the Hall elements and the bottom of the magnetic flux concentrator (μm) and the flux density (T) (absolute values) on the magneto-sensitive surface. The changes in the thickness of the magnetic flux concentrator are used as a parameter.

Figure 14:
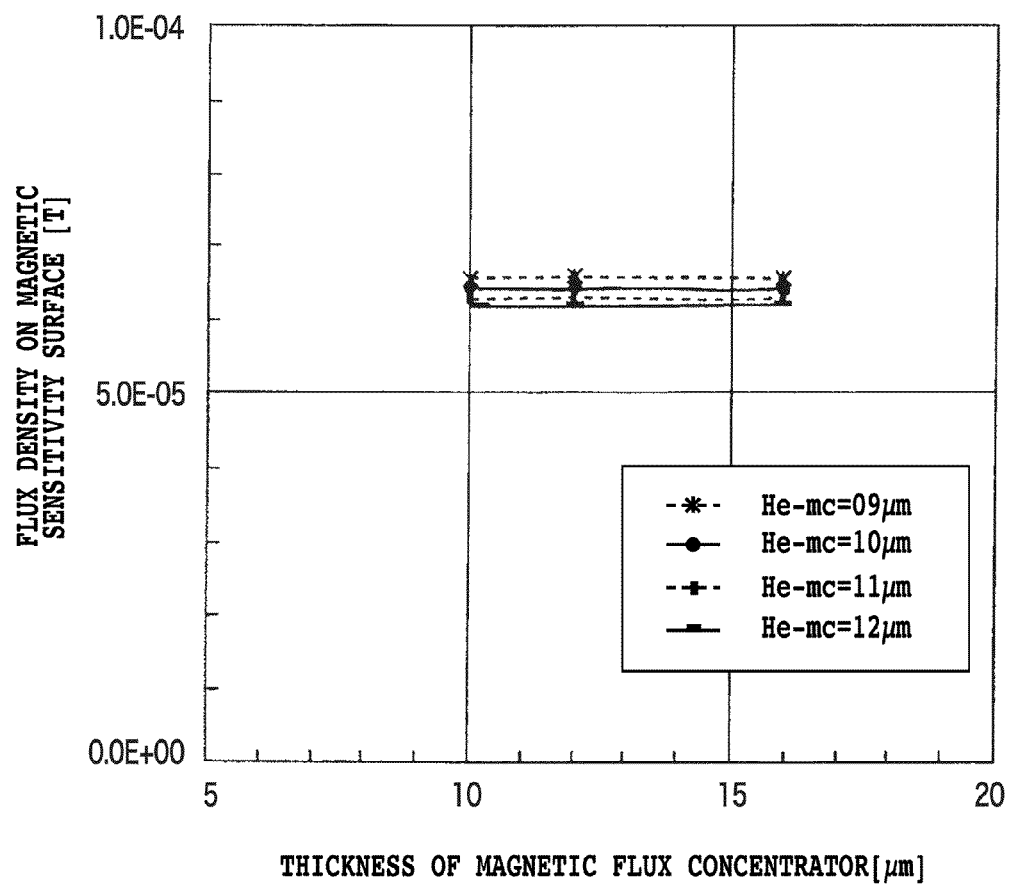
FIG. 14 is a diagram showing relationships between the thickness T (μm) of the magnetic flux concentrator and the flux density (T) (absolute values) on the magneto-sensitive surface when the distance between the Hall element (He) and the bottom of the magnetic flux concentrator (magnetic substance: Mc) is varied as a parameter, which shows an example of the loop coil at the self-diagnosis of the sensitivity.

FIG. 14 is a diagram showing relationships between the thickness of the magnetic flux concentrator T (μm) and the flux density (T) (absolute values) on the magneto-sensitive surface. Changes in the distance between the Hall elements (He) and the bottom of the magnetic flux concentrator (magnetic substance: Mc) is used as a parameter.

Figure 15:
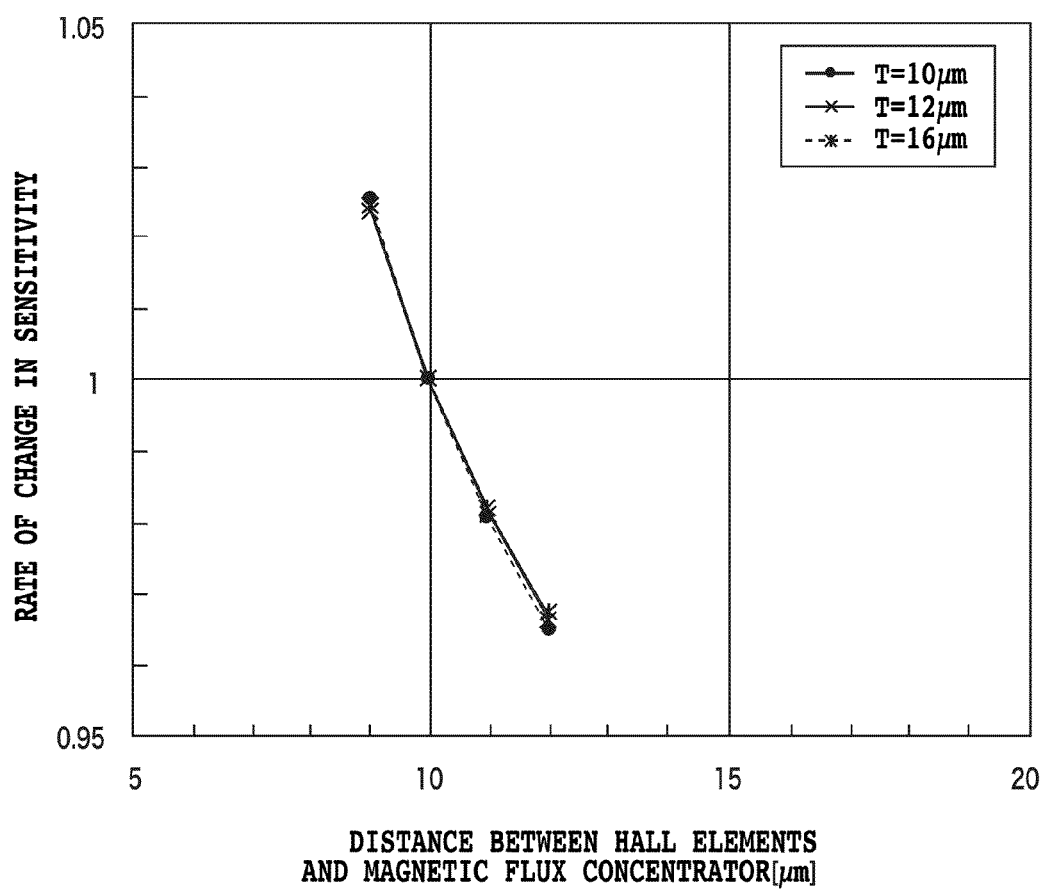
FIG. 15, which corresponds to FIG. 13, is a diagram showing relative changes for respective parameters when seen from a reference position.
Figure 16:
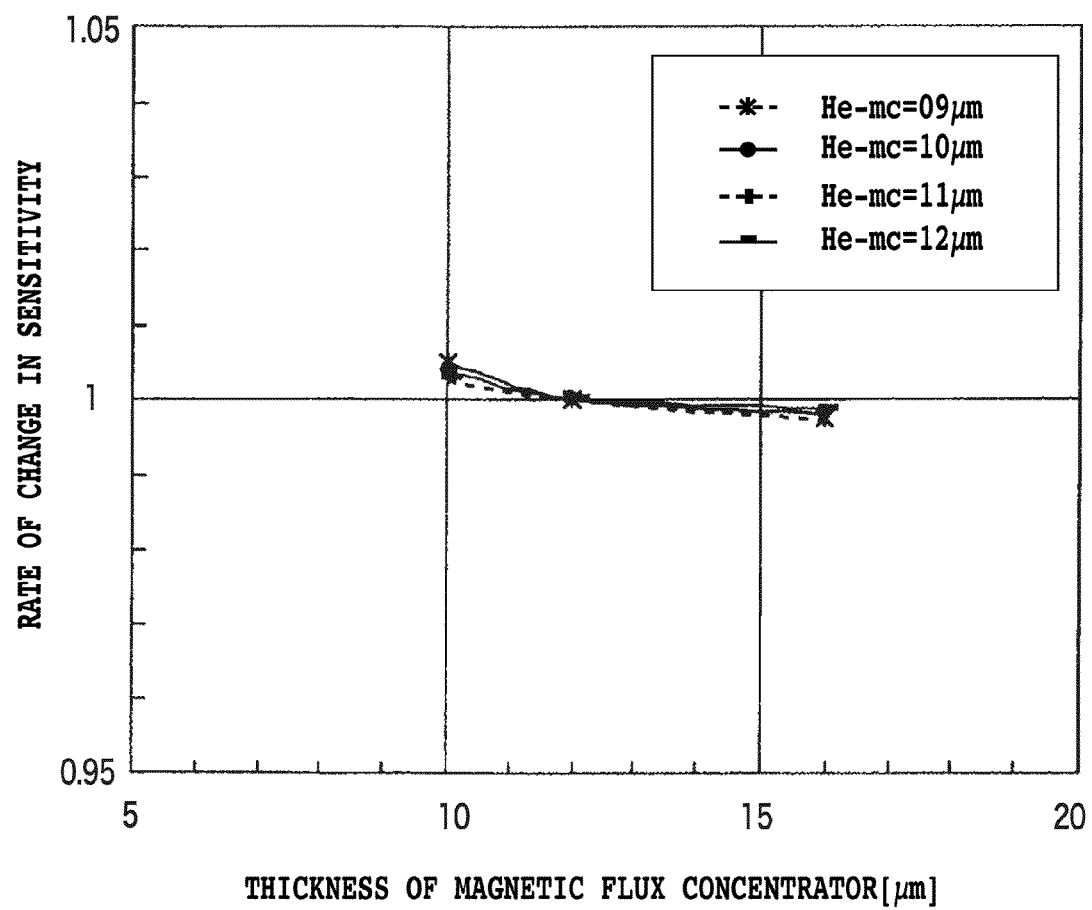
FIG. 16, which corresponds to FIG. 14, is a diagram showing relative changes for respective parameters when seen from the reference position.

Either of them shows an example of the loop coils at the time of self-diagnosis of the sensitivity. Incidentally, FIG. 15 and FIG. 16, which correspond to FIG. 13 and FIG. 14, are diagrams showing relative changes seen from the reference position for respective parameters.

It was determined that the diameter of the magnetic flux concentrator (round shape) was 310 μm, the Hall elements were placed at positions 5 μm inside (underside of the coil) from the edge of the magnetic flux concentrator, the shape of the coils was rectangular, the wiring width of the coils was 4 μm, the wiring spacing was 1 μm, the coils each consisted of 1 turn, and a current of 1 mA was passed through the coil. The vertical direction magnetic fields generated by the loop coils are sensed by the Hall elements right under the coils.

When the distance between the Hall elements and the bottom of the magnetic flux concentrator (vertical distance) was 9 to 12 μm, the magnetic field intensity on the magneto-sensitive surface of the Hall elements at the time of passing a current of 1 mA was about 64 μT. When the vertical distance varied from 9 to 11 μm, the sensitivity changed about 5%. When the thickness of the magnetic flux concentrator varied from 10 to 16 μm, the sensitivity changes of about 1% or less were seen. Thus, it was found that when the vertical distance or the thickness of the magnetic flux concentrator fluctuated with respect to the horizontal direction magnetic field, the magnetic field sensitivity the Hall elements perceived changed significantly.

Figure 8B:
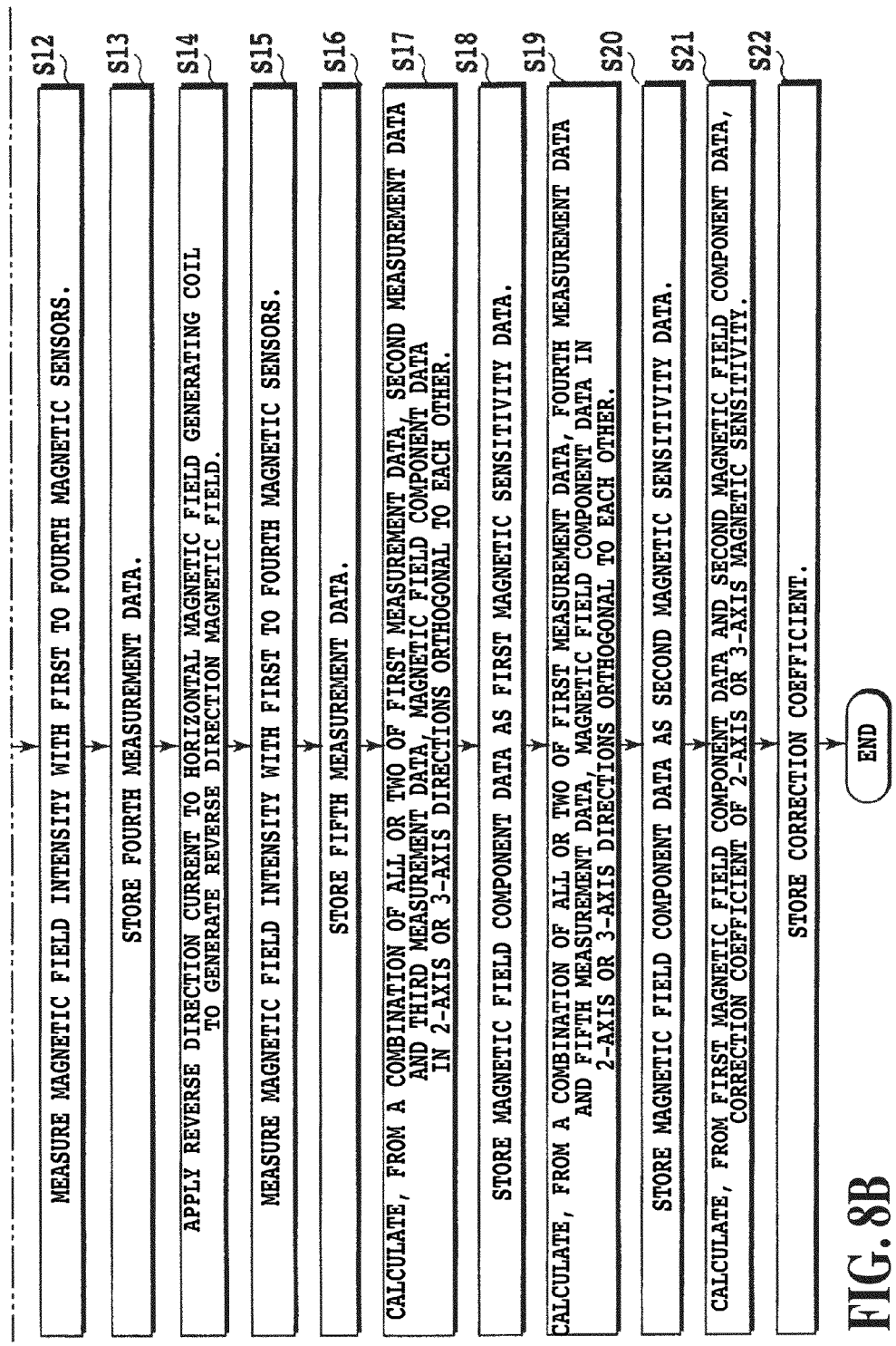
FIG. 8B is a diagram showing the flowchart for explaining the sensitivity measuring method in the sensitivity measuring device of the magnetic sensor in accordance with the present invention.

FIG. 8A and FIG. 8B are diagrams showing a flowchart for explaining a sensitivity measuring method in the sensitivity measuring device of the magnetic sensor in accordance with the present invention. The sensitivity measuring method of the magnetic sensor in accordance with the present invention is a sensitivity measuring method of measuring the sensitivity of the magnetic sensor shown in FIG. 4.

First, the sensitivity mode is set (step S1), and no current is supplied to the vertical magnetic field generating coils and the horizontal magnetic field generating coil (step S2). Next, the first to fourth magnetic sensors measure the magnetic field intensity (step S3). Next, the first measurement data is stored (step S4). Next, a current is passed through the vertical magnetic field generating coils to generate the magnetic fields (step S5). Next, the first to fourth magnetic sensors measure the magnetic field intensity (step S6). Next, the second measurement data is stored (step S7).

Next, a reverse direction current is passed through the vertical magnetic field generating coils to generate reverse direction magnetic fields (step S8). Next, the first to fourth magnetic sensors measure the magnetic field intensity (step S9). Next, the third measurement data is stored (step S10). Next, a current is passed through the horizontal magnetic field generating coil to generate the magnetic field (step S11). Next, the first to fourth magnetic sensors measure the magnetic field intensity (step S12). Next, the fourth measurement data is stored (step S13).

Next, a reverse direction current is passed through the horizontal magnetic field generating coil to generate the reverse direction magnetic field (step S14). Next, the first to fourth magnetic sensors measure the magnetic field intensity (step S15). Next, the fifth measurement data is stored (step S16).

Next, from a combination of all or two of the first measurement data, second measurement data and third measurement data, the magnetic field component data in the 2-axis or 3-axis directions orthogonal to each other are computed (step S17). Next, the magnetic field component data are stored as the first magnetic sensitivity data (step S18).

Next, from a combination of all or two of the first measurement data, fourth measurement data and fifth measurement data, the magnetic field component data in the 2-axis or 3-axis directions orthogonal to each other are computed (step S19). Next, the magnetic field component data are stored as the second magnetic sensitivity data (step S20).

Next, from the first magnetic field component data and second magnetic field component data, the correction coefficient of the 2-axis or 3-axis magnetic sensitivity is computed (step S21). Next, the correction coefficient is stored (step S22). In this way, the self-sensitivity correction for the sensitivity deviation becomes possible, and furthermore, the self-diagnosis based on the validity of the sensitivity decision of the magnetic sensor becomes possible.

INDUSTRIAL APPLICABILITY

The present invention relates to a magnetic sensor and sensitivity measuring method thereof for providing the sensitivity measuring function to the magnetic sensor having the semiconductor substrate which has a plurality of Hall elements provided separately from each other, and the magnetic substance mounted on the semiconductor substrate. It can measure the sensitivity of the magnetic sensor to the vertical direction magnetic field and to the horizontal direction magnetic field. In addition, as for the sensitivity in the 3-axis directions of the magnetic sensor orthogonal to each other, it can possess the function of correcting the sensitivity deviation resulting from the process dependence variations at the time of forming the Hall elements or magnetic substance or from the sensitivity variations of the integrated circuit. Furthermore, it enables the self-diagnosis based on the validity of the sensitivity decision of the magnetic sensor, and the self-sensitivity correction (adjustment) for the sensitivity deviation.

The invention claimed is:

1. A magnetic sensor comprising:
   a semiconductor substrate having a plurality of magnetic sensitive elements placed separately from each other;
   a magnetic substance having an edge which is near the plurality of magnetic sensitive elements; and
   a coil arranged between the plurality of magnetic sensitive elements,
   wherein the plurality of magnetic sensitive elements and the coil are placed on the same side with respect to the magnetic substance.

2. The magnetic sensor as claimed in claim 1, comprising: 2-axis or 3-axis detection axes orthogonal to each other.

3. The magnetic sensor as claimed in claim 2, further comprising
   a sensitivity calculating unit for calculating sensitivity from magnetic field intensity information about individual axes at the plurality of magnetic sensitive elements of the magnetic sensor.

4. The magnetic sensor as claimed in claim 3, wherein the sensitivity calculating unit comprises:
   an axial component analyzing unit for separating the magnetic field intensity information from the magnetic sensor into components of the individual axes;
   a sensitivity decision unit for deciding the sensitivity by comparing the individual axial components of the magnetic field intensity information from the axial component analyzing unit with a prescribed reference value; and
   a sensitivity correction unit for carrying out sensitivity correction in accordance with sensitivity information from the sensitivity decision unit.

5. The magnetic sensor as claimed in claim 4, further comprising a sensor diagnostic unit for carrying out self-diagnosis of validity of the sensitivity of the magnetic sensor according to the sensitivity information from the sensitivity decision unit.

6. The magnetic sensor as claimed in claim 1, wherein the coil is arranged on a side of the magnetic substance, the side including the semiconductor substrate.

7. The magnetic sensor as claimed in claim 6, wherein the coil is at least partly covered by the magnetic substance.

8. The magnetic sensor as claimed in claim 1, wherein the coil is at least partly covered by the magnetic substance.

9. The magnetic sensor as claimed in claim 8, wherein the coil is arranged between the magnetic substance and the semiconductor substrate.

10. The magnetic sensor as claimed in claim 8, wherein the coil is arranged between the magnetic substance and the magnetic sensitive elements.

11. The magnetic sensor as claimed in claim 8, wherein the coil is arranged in the semiconductor substrate.

12. The magnetic sensor as claimed in claim 1, wherein the coil is arranged between the magnetic substance and the semiconductor substrate.

13. The magnetic sensor as claimed in claim 1, wherein the coil is arranged between the magnetic substance and the magnetic sensitive elements.

14. The magnetic sensor as claimed in claim 1, wherein the coil is arranged in the semiconductor substrate.

15. The magnetic sensor as claimed in claim 1, wherein the coil is surrounded by at least three magnetic sensitive elements.

16. The magnetic sensor as claimed in claim 1, wherein the coil is surrounded by at least three magnetic sensitive elements and the magnetic substance.

17. The magnetic sensor as claimed in claim 1, wherein the coil is formed using a metal wiring layer in IC process.

18. The magnetic sensor as claimed in claim 1, further comprising:
a sensor diagnostic unit for carrying out self-diagnosis.

19. A magnetic sensor comprising:
a semiconductor substrate having a plurality of magnetic sensitive elements placed separately from each other;
a magnetic substance having an edge which is near the plurality of magnetic sensitive elements; and
a coil arranged on a side of the magnetic substance, the side including the plurality of magnetic sensitive elements,
wherein the plurality of magnetic sensitive elements and the coil are placed on the same side with respect to the magnetic substance.

20. The magnetic sensor as claimed in claim 19, wherein the side includes the semiconductor substrate.

21. The magnetic sensor as claimed in claim 19, further comprising:
vertical magnetic field generating units provided close to each of the plurality of magnetic sensitive elements for generating magnetic field components in a direction parallel to the magnetic sensitivity direction of the magnetic sensitive elements,
wherein the magnetic sensitive elements detect the magnetic field components generated by the vertical magnetic field generating units.

22. The magnetic sensor as claimed in claim 21, wherein the vertical magnetic field generating units are arranged near the edge of the magnetic substance, and are arranged on a side of the magnetic sensitive elements.

23. The magnetic sensor as claimed in claim 21, wherein the vertical magnetic field generating units are a loop coil each.

24. A sensitivity measuring method in the magnetic sensor as defined claim 21, the sensitivity measuring method comprising:
detecting the magnetic field components generated by the coil with the magnetic sensitive elements;
calculating sensitivity from flux density at the magnetic sensitive elements;
detecting the magnetic field components generated by the vertical magnetic field generating unit with the magnetic sensitive elements; and
calculating the sensitivity from the flux density at the magnetic sensitive elements.

25. The sensitivity measuring method of the magnetic sensor as claimed in claim 24, wherein the step of calculating the sensitivity comprises:
separating, with an axial component analyzing unit, magnetic field intensity information from the magnetic sensor into components of the individual axes;
deciding, with a sensitivity decision unit, the sensitivity by comparing the individual axial components of the magnetic field intensity information from the axial component analyzing unit with a prescribed reference value; and
carrying out, with a sensitivity correction unit, sensitivity correction in accordance with sensitivity information from the sensitivity decision unit.

26. The sensitivity measuring method of the magnetic sensor as claimed in claim 25, further comprising carrying out, with a sensor diagnostic unit, self-diagnosis of validity of the sensitivity of the magnetic sensor according to the sensitivity information from the sensitivity decision unit.

27. The magnetic sensor as claimed in claim 21 wherein the vertical magnetic field generating units are a coil each.

28. The magnetic sensor as claimed in claim 19, comprising:
2-axis or 3-axis detection axes orthogonal to each other.

29. The magnetic sensor as claimed in claim 28, further comprising
a sensitivity calculating unit for calculating sensitivity from magnetic field intensity information about individual axes at the plurality of magnetic sensitive elements of the magnetic sensor.

30. The magnetic sensor as claimed in claim 29, wherein the sensitivity calculating unit comprises:
an axial component analyzing unit for separating the magnetic field intensity information from the magnetic sensor into components of the individual axes;
a sensitivity decision unit for deciding the sensitivity by comparing the individual axial components of the magnetic field intensity information from the axial component analyzing unit with a prescribed reference value; and
a sensitivity correction unit for carrying out sensitivity correction in accordance with sensitivity information from the sensitivity decision unit.

31. The magnetic sensor as claimed in claim 30, further comprising
a sensor diagnostic unit for carrying out self-diagnosis of validity of the sensitivity of the magnetic sensor according to the sensitivity information from the sensitivity decision unit.

32. The magnetic sensor as claimed in claim 19, wherein the magnetic sensitive elements are Hall elements.

33. The magnetic sensor as claimed in claim 19, wherein the coil is a planar spiral coil.

34. The magnetic sensor as claimed in claim 19, wherein the coil is arranged between the magnetic substance and the semiconductor substrate.

35. The magnetic sensor as claimed in claim 19, wherein the coil is arranged between the magnetic substance and the magnetic sensitive elements.

36. The magnetic sensor as claimed in claim 19, wherein the coil is arranged in the semiconductor substrate.

37. The magnetic sensor as claimed in claim 19, wherein the coil is at least partly covered by the magnetic substance.

38. The magnetic sensor as claimed in claim 19, wherein the coil is formed using a metal wiring layer in IC process.

39. The magnetic sensor as claimed in claim 19, further comprising
a sensor diagnostic unit for carrying out self-diagnosis.

40. A magnetic sensor comprising:
a semiconductor substrate having a plurality of magnetic sensitive elements placed separately from each other;
a magnetic substance having an edge which is near the plurality of magnetic sensitive elements; and
a magnetic field generator arranged between the plurality of magnetic sensitive elements,
wherein the plurality of magnetic sensitive elements and the magnetic field generator are placed on the same side with respect to the magnetic substance.

41. The magnetic sensor as claimed in claim 40, wherein the magnetic field generator is a coil.

42. A magnetic sensor comprising:
a semiconductor substrate having a plurality of magnetic sensitive elements placed separately from each other;

a magnetic substance provided on a side of the semiconductor substrate; and a magnetic field generator arranged on a side of the magnetic substance, wherein the side of the magnetic substance includes the plurality of magnetic sensitive elements.

43. The magnetic sensor as claimed in claim 42, wherein the magnetic field generator is a coil.

\* \* \* \* \*